United States Patent
Saruki et al.

(10) Patent No.: US 7,916,434 B2
(45) Date of Patent: Mar. 29, 2011

(54) TUNNEL MAGNETORESISTIVE EFFECT ELEMENT WITH LIMITED ELECTRIC POPPING OUTPUT VOLTAGE

(75) Inventors: Shunji Saruki, Tokyo (JP); Kenji Inage, Tokyo (JP); Tetsuya Kuwashima, Tokyo (JP); Hiroshi Kiyono, Tokyo (JP); Katsumichi Tagami, Tokyo (JP); Kazumasa Fukuda, Tokyo (JP); Masahide Kohno, Tokyo (JP)

(73) Assignee: TDK Corporation, Tokyo (JP)

( * ) Notice: Subject to any disclaimer, the term of this patent is extended or adjusted under 35 U.S.C. 154(b) by 1175 days.

(21) Appl. No.: 11/387,876

(22) Filed: Mar. 24, 2006

(65) Prior Publication Data
US 2006/0221511 A1    Oct. 5, 2006

(30) Foreign Application Priority Data
Apr. 5, 2005   (JP) .................... 2005-108616

(51) Int. Cl.
*G11B 5/33* (2006.01)
(52) U.S. Cl. .................................. 360/324.2
(58) Field of Classification Search .......... 360/324.2
See application file for complete search history.

(56) References Cited

U.S. PATENT DOCUMENTS

| | | | |
|---|---|---|---|
| 6,452,204 B1* | 9/2002 | Ishiwata et al. | 257/9 |
| 6,655,006 B2* | 12/2003 | Pinarbasi | 29/603.07 |
| 6,812,039 B1 | 11/2004 | Kohlstedt et al. | |
| 6,841,395 B2* | 1/2005 | Linn et al. | 438/3 |
| 2001/0014001 A1* | 8/2001 | Aoshima et al. | 360/327.32 |
| 2002/0164828 A1 | 11/2002 | Ishiwata et al. | |

FOREIGN PATENT DOCUMENTS

| | | |
|---|---|---|
| JP | 2002-217471 | 8/2002 |
| JP | 2002-232040 | 8/2002 |
| JP | 2004-185676 | 7/2004 |
| JP | 2004-234755 | 8/2004 |

OTHER PUBLICATIONS

Japanese Patent Office Report dated Mar. 11, 2008.

* cited by examiner

*Primary Examiner* — David D Davis
(74) *Attorney, Agent, or Firm* — Frommer Lawrence & Haug LLP

(57) ABSTRACT

A TMR effect element with sufficiently reduced element resistance and restricted popping noise is provided, which comprises a tunnel barrier layer formed primarily of a metal oxide including many electric charge sites. The electric charge sites density n and the mobility $\mu$ of electrons trapped due to the electric charge sites satisfy a relationship expressed by: $0 < (n_{s1}^{-1} - n_{s2}^{-1})^{-1} \cdot (\mu_0 - \mu) \cdot (n\mu)^{-1} < 0.2$, where $n_{s1}$ and $n_{s2}$ are densities of tunnel electrons when an element resistance is a minimum and maximum respectively during reading signals and $\mu_0$ is the mobility of electrons when not trapped.

7 Claims, 17 Drawing Sheets

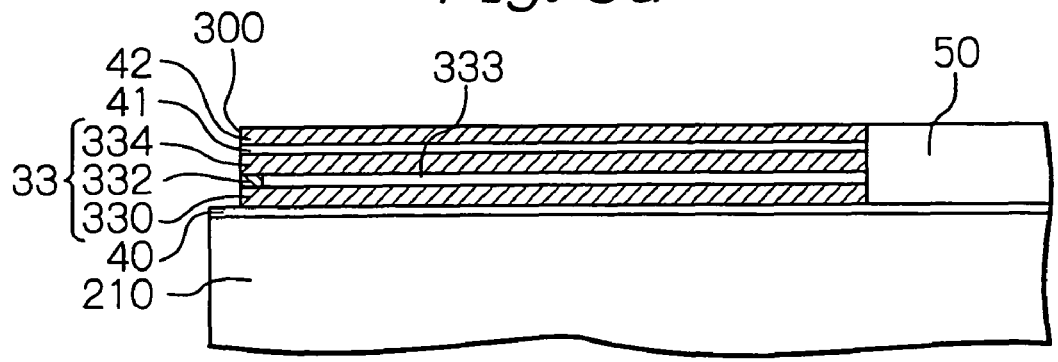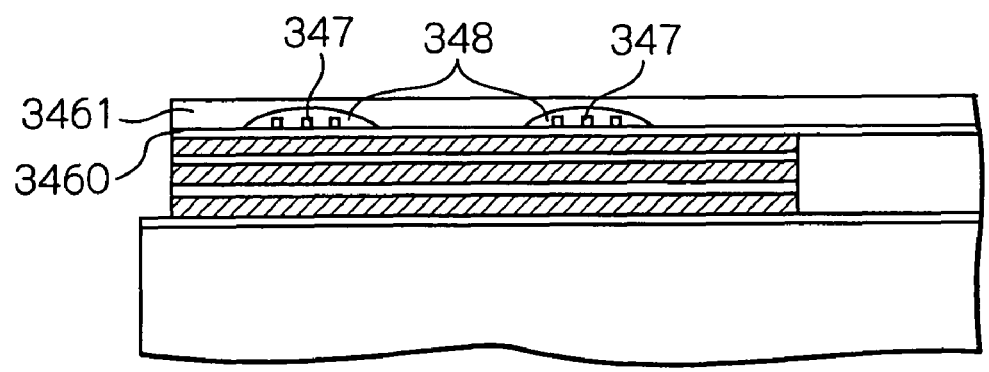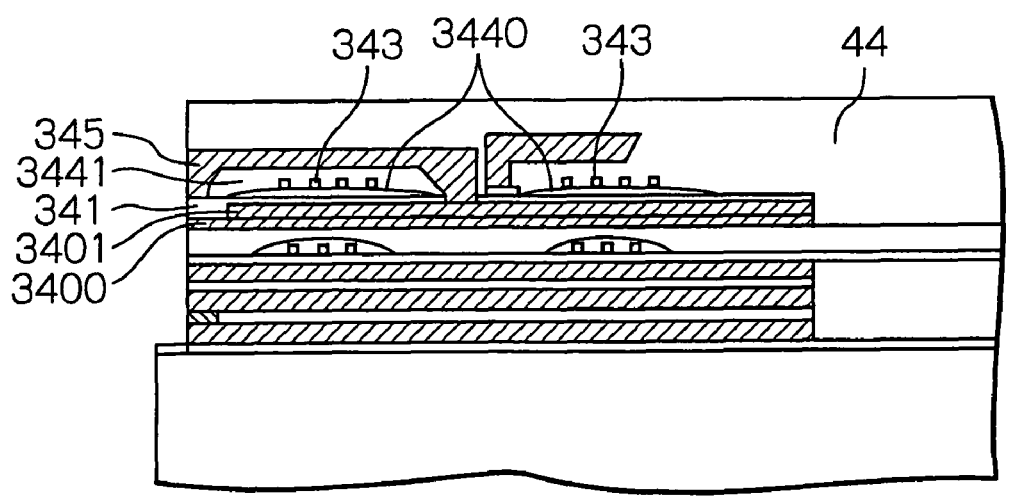

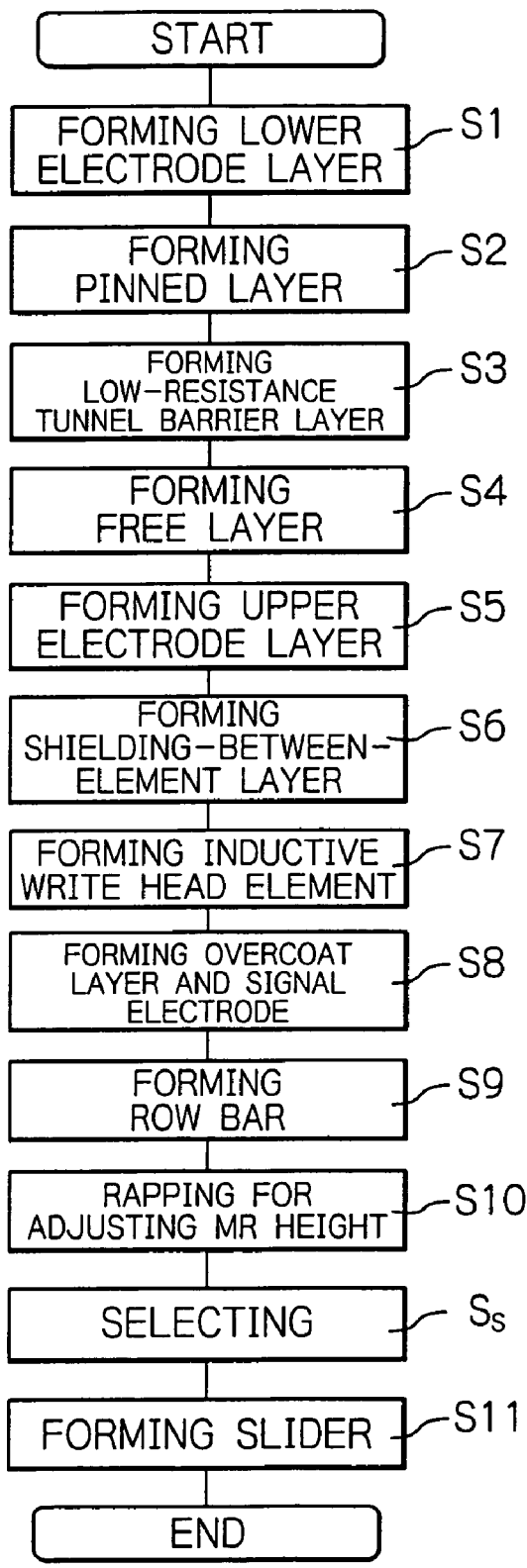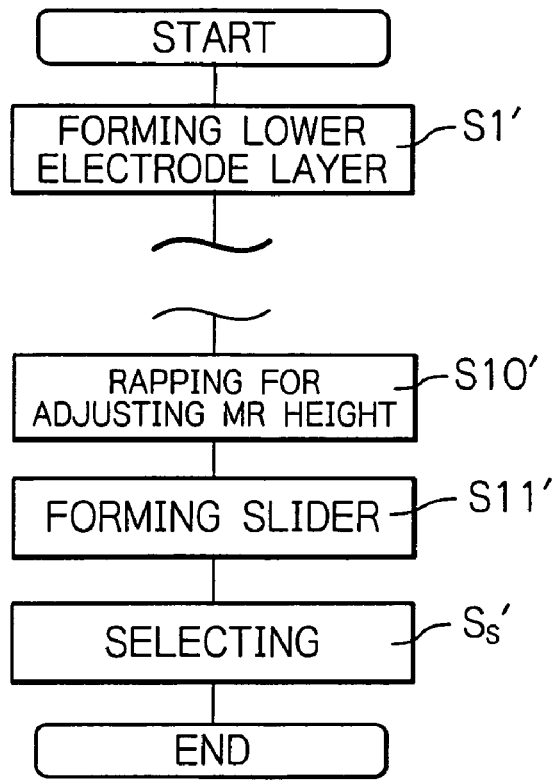

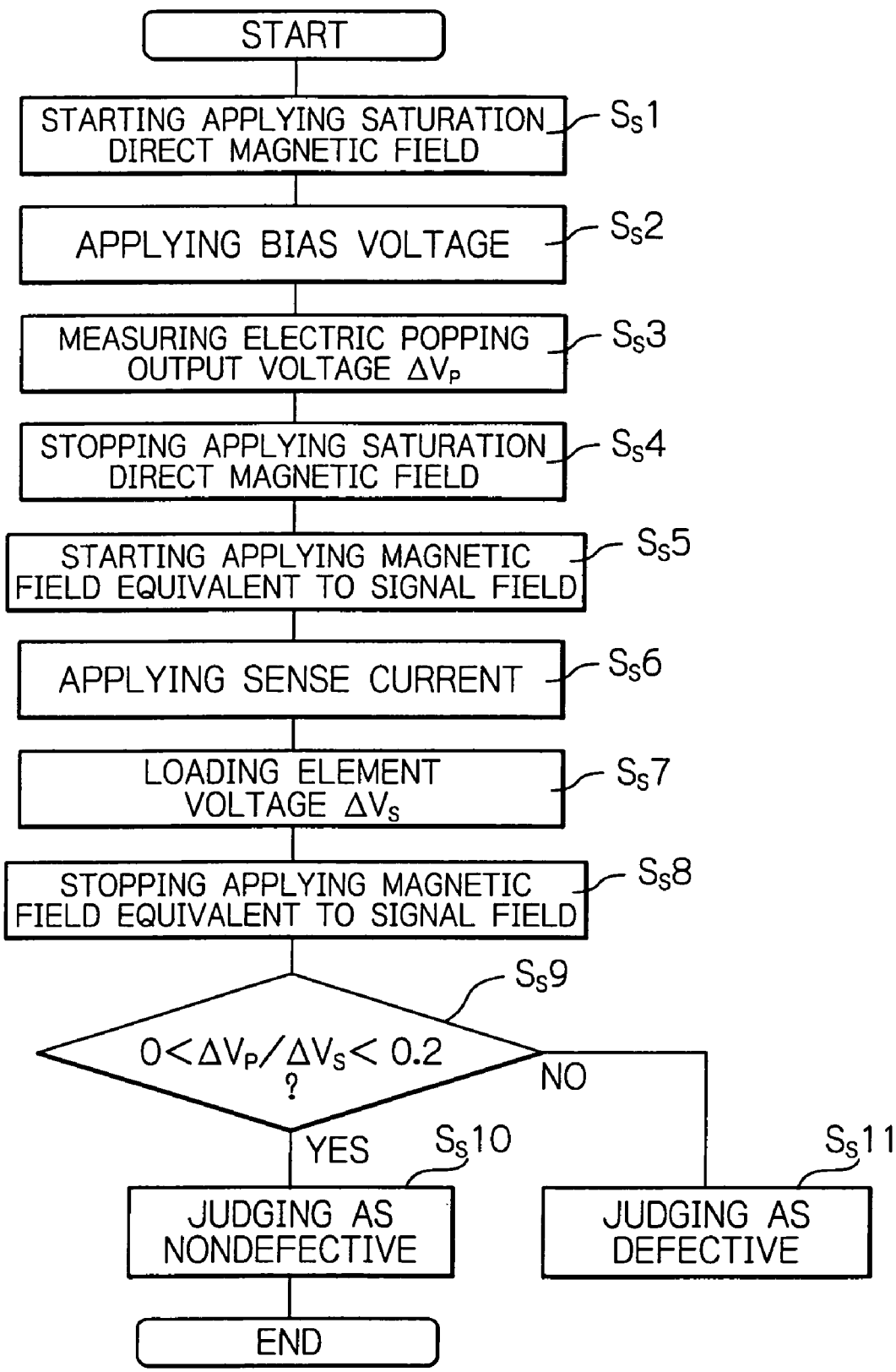

_US 7,916,434 B2_

TUNNEL MAGNETORESISTIVE EFFECT ELEMENT WITH LIMITED ELECTRIC POPPING OUTPUT VOLTAGE

PRIORITY CLAIM

This application claims priority from Japanese patent application No. 2005-108616, filed on Apr. 5, 2005, which is incorporated herein by reference.

BACKGROUND OF THE INVENTION

1. Field of the Invention

The present invention relates to a tunnel magnetoresistive (TMR) effect element which detects a signal field and indicates a resistance variation according to the magnetic field, a thin-film magnetic head provided with this TMR effect element, a head gimbal assembly (HGA) provided with this thin-film magnetic head and a magnetic disk drive apparatus provided with this HGA. The present invention further relates to an testing method and inspection apparatus, and manufacturing method for the TMR effect element.

2. Description of the Related Art

With the increasing capacity and decreasing size of a magnetic disk drive apparatus, higher sensitivity and higher output are required for a thin-film magnetic head. In response to this demand, a TMR effect that can be expected to have a rate of resistance change at least twice that of a giant magnetoresistive (GMR) effect currently being applied to reading of a signal field, is increasing attention. Actually, the thin-film magnetic head provided with the TMR effect element for reading is positively developed.

The TMR effect element has a structure in which a tunnel insulating layer which acts as an energy barrier for a tunnel effect is interposed between a pinned-magnetization-direction layer (pinned layer) whose magnetization direction is fixed and a free-magnetization-direction layer (free layer) whose magnetization direction is variable according to a magnetic field applied thereto. The existence of this tunnel insulating layer causes the TMR effect element to have a higher element resistance value than other magnetoresistive (MR) effect elements. Such a high element resistance generally causes the element resistance and stray capacitance to form a low pass filter circuit and causes the cutoff frequency of the element to decrease, preventing the higher frequency performance that is indispensable to the high recording density. Furthermore, the high element resistance also increases shot noise derived from random motion of electrons responsible for electric conductivity in the element. As a result, the SN ratio of the element output decreases.

On the other hand, a magnetic disk drive apparatus using a perpendicular magnetic recording system is being introduced in recent years to realize the higher recording density. The perpendicular magnetic recording system has a higher level of medium noise compared to a conventional longitudinal magnetic recording system, and therefore requirements for a lower noise ratio of the magnetic head is relatively alleviated. Therefore, the use of the TMR effect element in the perpendicular magnetic recording system for reading is quite promising in that the high output of the element can be utilized effectively. However, in order to realize the higher recording density, the reduction of the element resistance is becoming unavoidable for the perpendicular magnetic recording system to respond to requirements for the higher frequency and improve the SN ratio.

Furthermore, in the TMR effect element, a current flows through not only a metal but also a dielectric material of the tunnel insulating layer. The characteristic of the tunnel current flowing through this dielectric material causes the temperature coefficient of the element resistance to incline toward the negative value side. When a TMR effect element with a relatively large negative value of the temperature coefficient is used for the magnetic head, the output may become unstable due to a resistance variation caused by a variation in the ambient temperature as in the case of the GMR head with a positive value of the temperature coefficient as metal conductivity. Especially, thermal asperity due to the contact between the element and the medium is becoming a problem.

As a measure for these problems, Japanese Patent Publication No. 2004-185676 A discloses a thin-film magnetic head including a TMR effect element having a flat temperature gradient of the resistance value of the element (head). Furthermore, according to U.S. Pat. No. 6,452,204 and US Patent Publication No. 2002/0164828 A1, the resistance value of a tunnel junction MR effect film is lowered to $5 \times 10^{-5}$ $\Omega cm^2$ or below to avoid thermal asperity. Furthermore, according to U.S. Pat. No. 6,812,039, oxidation of a metal layer during formation of a tunnel insulating layer is supported by UV light and its resistance value is lowered to less than 10 $k\Omega \mu m^2$.

Furthermore, Japanese Patent Publication No. 2004-234755A discloses a thin-film magnetic head in which a resistor is connected in parallel to a TMR effect element, and a resistance value of the element, a resistance value of the resistor and a product RA of the resistance value of the element and cross-sectional area of the element are defined. Furthermore, Japanese Patent Publication No. 2002-217471 A discloses a ferromagnetic tunnel junction element provided with a current channel formed in parallel to a tunnel current channel and describes pinholes formed in a (tunnel) insulating layer as this current channel formed in parallel.

In the case of the above-described TMR effect element or the thin-film magnetic head having such an element, there is a problem that a considerable amount of popping noise occurs even when the resistance value of the element or the temperature coefficient of the resistance is limited to a predetermined range.

The reduction of the resistance of the TMR effect element has been required as described above. In this respect, as is also described in Japanese Patent Publication No. 2004-185676 A, for example, it is assumed that "the absolute resistance value of the element (head) reduces" as "the proportion of pinholes in the tunnel barrier layer increases." As a result, it is further assumed to be possible to "achieve a reduction of noise." Indeed, the resistance-dependent shot noise or the like decreases as the element resistance decreases.

On the other hand, however, the popping noise increases depending on the element, causing inconvenience such as errors in reproduction output depending on the degree of noise. That is, a considerable amount of popping noise occurs even with the elements described in the above described documents which conform to predetermined specifications about element resistance, and so it is very difficult to improve the SN ratio through the reduction of noise and prevent errors in reproduction output.

Here, as a popping noise occurring in a TMR effect element, only magnetic factors derived from a magnetization state in the TMR effect element such as Barkhausen noise are conventionally known. However, as described above, a popping noise whose causes and factors for determining intensity are actually not clarified occurs, and it is quite difficult to implement measures.

SUMMARY OF THE INVENTION

Therefore, it is an object of the present invention to provide a TMR effect element in which the element resistance is sufficiently reduced and the popping noise is suppressed, a thin-film magnetic head provided with this TMR effect element, an HGA provided with this thin-film magnetic head and a magnetic disk drive apparatus provided with this HGA.

Furthermore, it is another object of the present invention to provide a testing method and a testing apparatus for a TMR effect element in which the element resistance is sufficiently reduced and the popping noise is suppressed, and a manufacturing method thereof.

Before explaining the present invention, terms used in the present specification will be defined. In a multilayered structure of a TMR effect element or a thin-film magnetic head formed on the element-formed surface of a substrate on which the element is formed, a layer or part thereof positioned on the element-formed surface side in relation to a reference layer is defined to be "lower part" or to be located "below" and a layer or part thereof positioned on the opposite side of the element-formed surface side in relation to the reference layer is defined to be "upper part" or to be located "above."

According to the present invention, a TMR effect element is provided, which comprises: a tunnel barrier layer formed primarily of a metal oxide; and two ferromagnetic layers stacked so as to sandwich the tunnel barrier layer, the tunnel barrier layer including many electric charge sites, and a density n of the many electric charge sites in the tunnel barrier layer and a mobility μ of electrons trapped due to the many electric charge sites satisfying a relationship expressed by:

$$0<(n_{s1}^{-1}-n_{s2}^{-1})^{-1}\cdot(\mu_0-\mu)\cdot(n\mu)^{-1}<0.2$$

where $n_{s1}$ and $n_{s2}$ are densities of tunnel electrons when an element resistance is a minimum and maximum respectively during reading signals and $\mu_0$ is the mobility of electrons when not trapped.

Here, the electric charge site is a site involved in (or involving) trapping of electrons responsible for conductivity, or more specifically is an area adjacent to metal positive ions or metal atoms where electrons can be trapped. Oxygen defects are generated around the metal positive ions or metal atoms that are the core of the electric charge sites. As a result, electrons trapped in the oxygen defect positions or electrons emitted from the oxygen defect positions become electric charge carriers.

The tunnel barrier layer according to the present invention has appropriate properties as an resistor due to the inclusion of such many electric charge sites. As a result, the element resistance of the TMR effect element according to the present invention is sufficiently small compared to that of the conventional elements.

Furthermore, when n and μ in the tunnel barrier layer satisfy $0<(n_{s1}^{-1}-n_{s2}^{-1})^{-1}\cdot(\mu_0-\mu)\cdot(n\mu)^{-1}<0.2$, the adverse effect that the popping noise increases due to low resistance, which has been a conventional problem, can be reliably avoided as will be described later. As a result, the high-frequency characteristic of the element output improves and it is possible to realize a TMR effect element having an SN ratio available to an apparatus such as a magnetic disk drive apparatus.

According to the present invention, a TMR effect element is further provided, which comprises: a tunnel barrier layer formed primarily of a metal oxide; and two ferromagnetic layers stacked so as to sandwich the tunnel barrier layer, the tunnel barrier layer including many electric charge sites, and electric popping output voltage due to the presence of the many electric charge sites occurring when a bias voltage is applied for 5 microseconds or more in a direction perpendicular to a surface of the tunnel barrier layer with the TMR element magnetically saturated.

The inventors of the present invention analyzed the popping noise in a TMR effect element in detail, whose reduction has been required, and has successfully separated the popping noise into an output voltage caused by the magnetization state of the element and an electric popping output voltage for the first time. Furthermore, the inventors have come up with the present invention by discovering that the electric popping output voltage is related to the above-described electric charge sites. That is, in the TMR effect element in which the electric charge sites exist and the electric popping output voltage has been generated to an appropriate degree, the resistance value of the element becomes sufficiently small and the SN ratio available to an apparatus such as a magnetic disk drive apparatus is assured.

Furthermore, the causes of the popping noise and the factors determining intensity thereof have not been completely clarified in the conventional art. Therefore, the low resistance could have been realized, however the popping noise could have not been controlled. On the other hand, the present invention can implement measures against noise, as well as realizing low resistance, by separating the electric popping output voltage from popping noises and evaluating it. Once the element is manufactured, the electric popping output voltage is stabilized and can be controlled sufficiently.

Here, it is preferable that $\Delta V_P$ satisfies a relationship of:

$$0<\Delta V_P/\Delta V_S<0.2,$$

where $\Delta V_P$ is an intensity of the electric popping output voltage and $\Delta V_S$ is element output voltage. By satisfying this relationship, it is possible to realize a reduction of resistance with the presence of electric charge sites and reliably avoid the increase of popping noise due to the reduction of resistance. As a result, the high frequency characteristic of the element output is improved and a TMR effect element having an SN ratio available to an apparatus such as a magnetic disk drive apparatus can be obtained.

Furthermore, the tunnel barrier layer is preferably formed primarily of a compound of metal or alloy made of one, two or more elements of Al, Ti, Mg, Hf, Zr, Si, Ta, Mo and W with oxygen, or of a compound of alloy with oxygen obtained by adding one, two or more elements of Fe, Ni, Cr, Mn, Co, Rh, Pd, Cd, Ir, Zn, Ba, Ca, Li, Na, K and P, having a lower oxidation free energy than the metal or alloy, to the metal or alloy.

Furthermore, the tunnel barrier layer is preferably formed by oxidizing a metal layer in an atmosphere including one, two or more of oxygen molecules, oxygen atoms, oxygen ions, ozone ($O_3$) and dinitrogen oxide ($N_2O$). Here, the metal layer is preferably formed primarily of a metal or alloy made of one, two or more elements of Al, Ti, Mg, Hf, Zr, Si, Ta, Mo and W, or of an alloy obtained by adding one, two or more elements of Fe, Ni, Cr, Mn, Co, Rh, Pd, Cd, Ir, Zn, Ba, Ca, Li, Na, K and P, having a lower oxidation free energy than the metal or alloy, to the metal or alloy.

As a gas for oxidation of the metal layer, $O_3$ and $N_2O$ in particular have larger molecular weights than oxygen, and therefore generate more oxygen defects than when a normal oxygen gas is used. As a result, it is possible to form a layer including more electric charge sites. Furthermore, even in an atmosphere including oxygen molecules, oxygen atoms and oxygen ions, it is possible to form electric charge sites sufficiently by controlling partial pressures of these components and the temperature of the metal layer and so on.

Furthermore, as described above, the added element having lower oxidation free energy selected from the group of Fe, Ni, Cr, Mn, Co, Rh, Pd, Cd, Ir, Zn, Ba, Ca, Li, Na, K and P, is likely to become metal positive ions or metal atoms that contribute to the formation of electric charge sites in the tunnel barrier layer. That is, the addition of these elements makes it possible to positively form electric charge sites in the layer.

According to the present invention, a thin-film magnetic head is further provided, which comprises: at least one TMR effect element described above, as data reading means; and at least one inductive write head element as data writing means.

According to the present invention, a HGA is further provided, which comprises: the above-described thin-film magnetic head; trace conductors for supplying currents to the at least one TMR effect element and the at least one inductive write head element; and a support mechanism which supports the thin-film magnetic head.

According to the present invention, a magnetic disk drive apparatus is further provided, which comprises: at least one HGA described above; at least one magnetic disk; and a recording/reproducing circuit for controlling reading and writing operations by the at least one TMR effect element and the at least one inductive write head element.

According to the present invention, a testing method of a TMR effect element is further provided, which comprises steps of: applying an external magnetic field to the TMR effect element to have the TMR effect element magnetically saturated; measuring electric popping output voltage generated in element output voltage when a bias voltage is applied for 5 microseconds or more in a direction perpendicular to a layer surface of the TMR effect element; and evaluating the TMR effect element on the measurement result. Here, the step of evaluating the TMR effect element preferably includes judging whether the electric popping output voltage $\Delta V_P$ satisfies a relationship of $0<\Delta V_P/\Delta V_S<0.2$, where $\Delta V_S$ is the element output voltage.

Conventionally, the causes for popping noise generated in the TMR effect element and the factors for determining intensity thereof are actually not completely clarified, and therefore, it has been difficult to test and evaluate noises in the element. However, according to the testing method of the present invention, it is possible to separate electric popping output voltage generated even when the element is magnetically saturated by the application of an external magnetic field from the noise caused by the magnetization state of the element. As a result, it is possible to select a TMR effect element capable of both realizing low resistance and assuring an SN ratio available to an apparatus such as a magnetic disk drive apparatus.

According to the present invention, a manufacturing method of a TMR effect element is further provided, which comprises steps of: forming a first ferromagnetic layer and a metal layer on the first ferromagnetic layer; oxidizing the metal layer in an atmosphere including one, two or more of oxygen molecules, oxygen atoms, oxygen ions, ozone ($O_3$) and dinitrogen oxide ($N_2O$) to form a tunnel barrier layer; forming a second ferromagnetic layer on the tunnel barrier layer to form a TMR effect multilayer; forming a TMR effect element using the TMR effect multilayer as a main part; and selecting the TMR effect element by using the above-described testing method.

According to the present invention, a manufacturing method of a thin-film magnetic head is further provided, which comprises steps of: forming a TMR effect element on a slider wafer substrate by using a manufacturing method comprising steps of: forming a first ferromagnetic layer and a metal layer on the first ferromagnetic layer; oxidizing the metal layer in an atmosphere including one, two or more of oxygen molecules, oxygen atoms, oxygen ions, ozone ($O_3$) and dinitrogen oxide ($N_2O$) to form a tunnel barrier layer; forming a second ferromagnetic layer on the tunnel barrier layer to form a TMR effect multilayer; and forming a TMR effect element using the TMR effect multilayer as a main part; cutting the slider wafer substrate into row bars on which the formed TMR effect elements are aligned; polishing the row bar for adjusting an MR height; and selecting the TMR effect elements on the row bar by using the above-described testing method.

According to the present invention, a manufacturing method of a thin-film magnetic head is further provided, which comprises a step of: forming a TMR effect element on a slider wafer substrate by using a manufacturing method comprising steps of: forming a first ferromagnetic layer and a metal layer on the first ferromagnetic layer; oxidizing the metal layer in an atmosphere including one, two or more of oxygen molecules, oxygen atoms, oxygen ions, ozone ($O_3$) and dinitrogen oxide ($N_2O$) to form a tunnel barrier layer; forming a second ferromagnetic layer on the tunnel barrier layer to form a TMR effect multilayer; and forming a TMR effect element using the TMR effect multilayer as a main part; cutting the slider wafer substrate into row bars on which the formed TMR effect elements are aligned; polishing the row bar for adjusting an MR height; cutting and separating the row bar into individual thin-film magnetic heads; and selecting the TMR effect elements on the individual thin-film magnetic heads by using the above-described testing method.

According to the present invention, a testing apparatus for a TMR effect element is further provided, which comprises: a magnetic field application means for applying an external magnetic field to the TMR effect element to have the TMR effect element magnetically saturated; a voltage application means for applying a bias voltage to the TMR effect element for 5 microseconds or more; a measuring means for measuring electric popping output voltage generated in element output voltage of the TMR effect element; and an evaluating means for evaluating the TMR effect element on measured values of the electric popping output voltage $\Delta V_P$ and the element output voltage $\Delta V_S$. Here, the evaluating means preferably includes a means for judging whether the electric popping output voltage $\Delta V_P$ satisfies a relationship of $0<\Delta V_P/\Delta V_S<0.2$.

Further objects and advantages of the present invention will be apparent from the following description of preferred embodiments of the invention as illustrated in the accompanying drawings. Some elements have been designated with same reference numerals in the different drawings.

BRIEF DESCRIPTION OF THE SEVERAL VIEWS OF THE DRAWINGS

FIG. 3b shows a plain view schematically illustrating a magnetic head element of FIG. 3a;

FIGS. 5a to 5c show cross-sectional views taken along the line A-A in FIG. 3b illustrating manufacturing steps of the magnetic head element in the embodiment in FIG. 4;

FIG. 14a shows a flow chart schematically illustrating an embodiment of the manufacturing method of a thin-film magnetic head according to the present invention;

FIG. 14b shows a flow chart schematically illustrating another embodiment of the manufacturing method;

FIG. 16 shows a flow chart schematically illustrating the selecting step of the thin-film magnetic head according to the present invention.

DETAILED DESCRIPTION OF THE INVENTION

Figure 1:
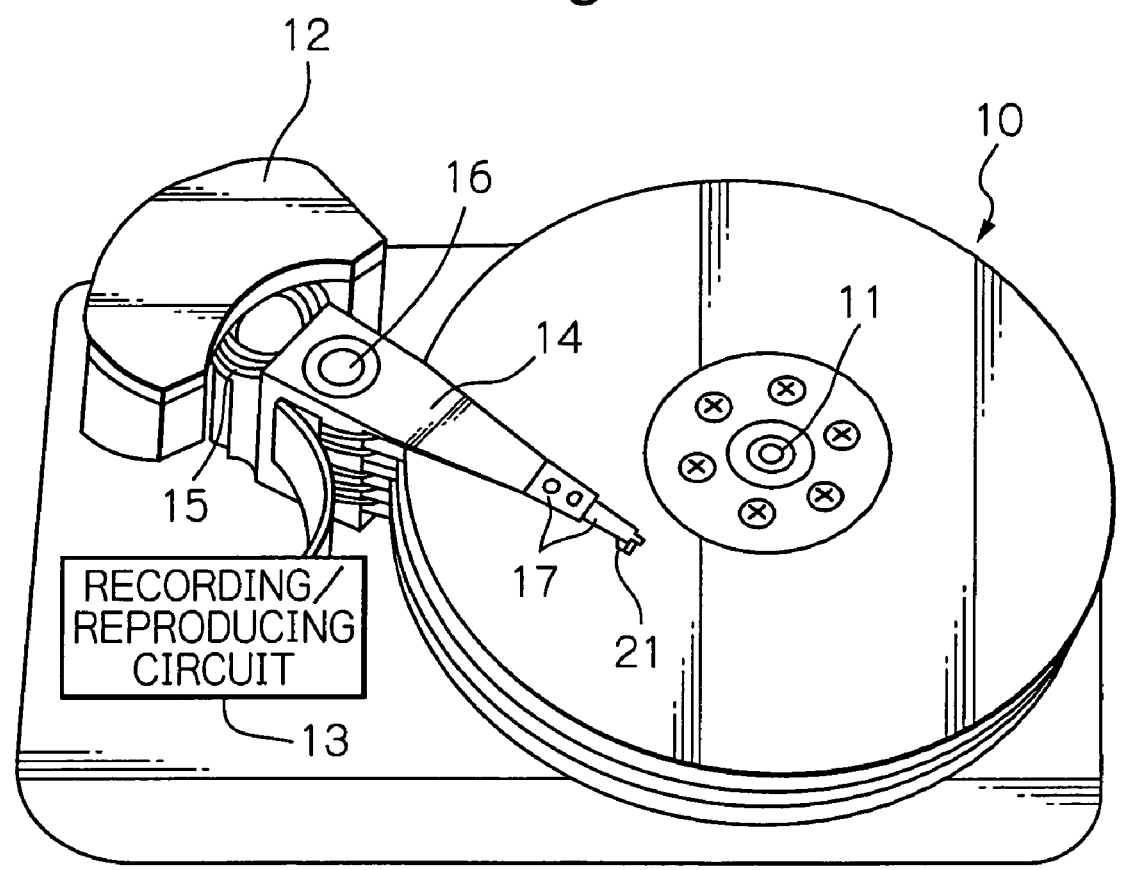
FIG. 1 shows a perspective view schematically illustrating a main structure of an embodiment of a magnetic disk drive apparatus according to the present invention.

With reference to the attached drawings, embodiments for implementing the present invention will be explained in detail below. The same elements in the respective drawings are assigned the same reference numerals. Furthermore, the dimensional ratios in the components and between the components in the drawings are arbitrarily set to improve the viewability of the drawings.

Figure 2:
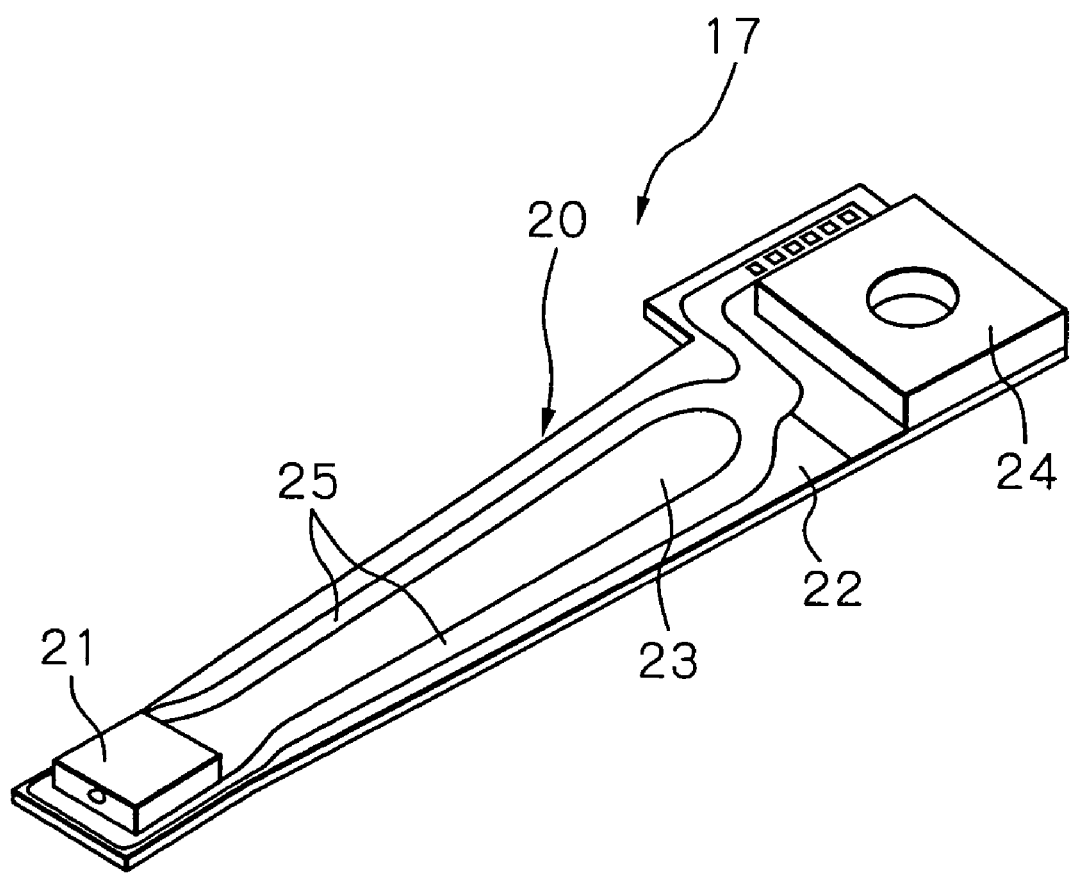
FIG. 2 shows a perspective view illustrating an embodiment of an HGA according to the present invention.
Figure 3A:
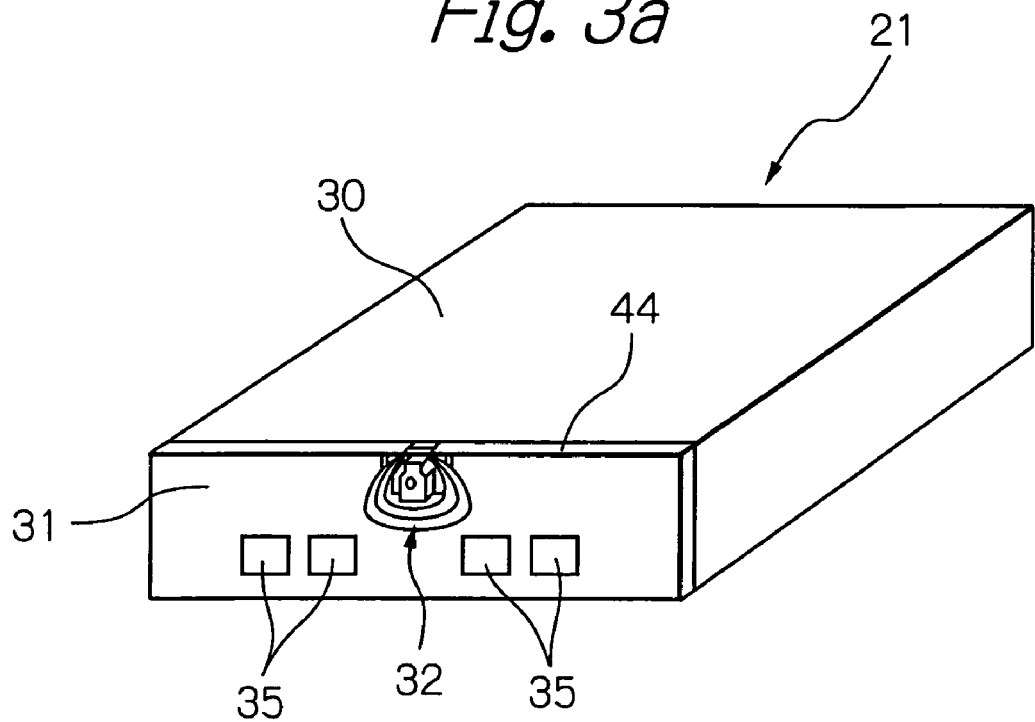
FIG. 3a shows a perspective view of a thin-film magnetic head attached to an end of the HGA of FIG. 2.
Figure 3B:
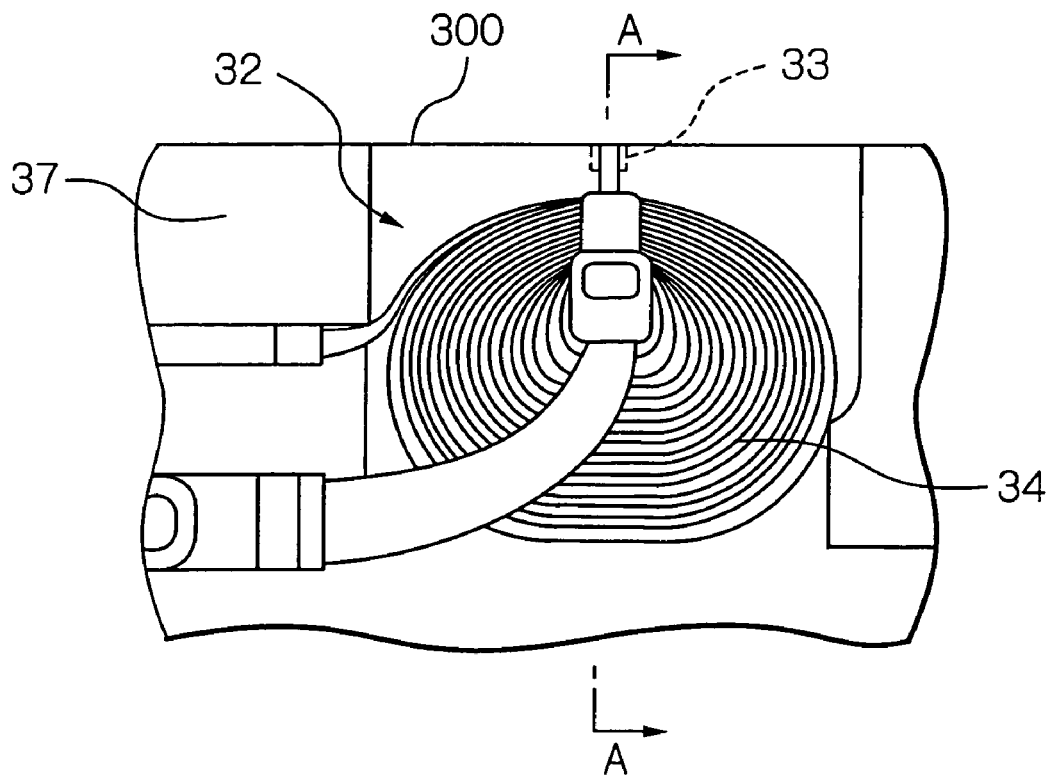

FIG. 1 shows a perspective view schematically illustrating a main structure of an embodiment of a magnetic disk drive apparatus according to the present invention, and FIG. 2 shows a perspective view illustrating an embodiment of an HGA according to the present invention. Furthermore, FIG. 3a shows a perspective view of a thin-film magnetic head (slider) attached to an end of the HGA of FIG. 2, and FIG. 3b shows a plain view schematically illustrating a magnetic head element 32 of FIG. 3a.

In FIG. 1, reference numeral 10 denotes a plurality of magnetic disks which rotate around the rotation axis of a spindle motor 11, 12 denotes an assembly carriage device for positioning a thin-film magnetic head (slider) 21 on a track and 13 denotes a recording/reproducing circuit for controlling read/write operations of this thin-film magnetic head, respectively.

The assembly carriage device 12 is provided with a plurality of drive arms 14. These drive arms 14 are rotatable around a pivot bearing axis 16 by a voice coil motor (VCM) 15 and stacked in a direction along this axis 16. An HGA 17 is attached to an end of each drive arm 14. Each HGA 17 is provided with the thin-film magnetic head (slider) 21 so as to face the surface of each magnetic disk 10. The magnetic disk 10, drive arm 14, HGA 17 and slider 21 may also be single.

Though not shown in the figure, the recording/reproducing circuit 13 is provided with a recording/reproducing control LSI, a write gate which receives recorded data from the recording/reproducing control LSI, a write circuit which outputs a signal from the write gate to an inductive write head element described later, a constant current circuit which supplies a sense current to a TMR effect element described later, an amplifier which amplifies an element output voltage of the TMR effect element and a demodulator circuit which outputs reproduced data to the recording/reproducing control LSI.

As shown in FIG. 2, the HGA 17 is constructed with the slider 21 having a magnetic head element fixed at an end of the suspension 20, and with an end of a wiring member 25 electrically connected to signal electrodes of the slider 21.

The suspension 20 is principally constructed of a load beam 22, a flexure 23 fixed onto this load beam 22 and having elasticity, a base plate 24 provided on a base part of the load beam 22 and the wiring member 25 provided on the flexure 23 and made up of trace conductors and connection pads electrically connected to both ends thereof. Though not shown, it is also possible to mount a head drive IC chip at some midpoint of the suspension 20.

As shown in FIG. 3a, the thin-film magnetic head (slider) 21 according to this embodiment is provided with an air bearing surface (ABS) 30 processed so as to obtain an appropriate flying height, a magnetic head element 32 formed on an element-formed surface 31 and four signal electrodes 35 exposed from the surface of an overcoat layer 44 formed on the element-formed surface 31. Here, the magnetic head element 32 is constructed of a TMR effect element 33 and an inductive write head element 34. Furthermore, the four signal electrodes 35 are connected to the TMR effect element 33 and inductive write head element 34 in two units respectively.

As shown in FIG. 3b, in the TMR effect element 33 and inductive write head element 34, one ends of the elements reach a head end face 300 on the ABS 30 side. With these ends facing the magnetic disk, a reading by sensing a signal field and a writing by applying a signal field are performed.

Figure 4:
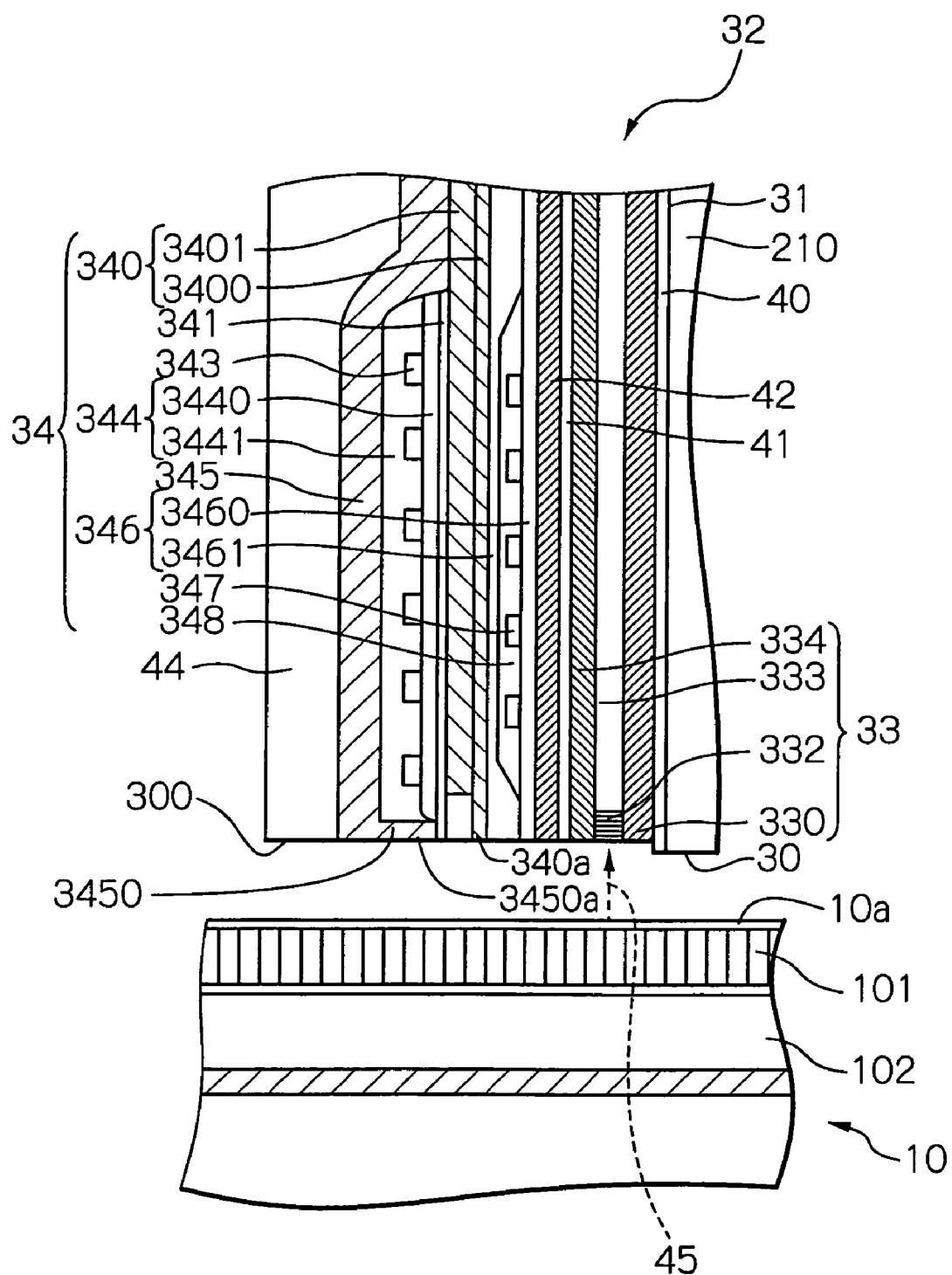
FIG. 4 shows a cross-sectional view taken along a line A-A of FIG. 3b illustrating the magnetic head element according to the embodiment in FIG. 3b.

FIG. 4 shows a cross-sectional view taken along a line A-A of FIG. 3b illustrating the magnetic head element 32 according to the embodiment in FIG. 3b. The number of turns of the coil in the figure appears to be smaller than the number of turns in FIG. 3b for simplicity of the drawing. The coil layer may be a single layer, two or more layered or a helical coil layer. Furthermore, FIG. 4 shows a cross-sectional view of the magnetic disk 10 together.

In FIG. 4, reference numeral 210 denotes a slider substrate with the ABS 30 which hydrodynamically flies over a rotating magnetic disk surface 10a by a predetermined flying height during writing and reading operations. The TMR effect element 33, the inductive write head element 34, a shielding-between-elements layer 42 for magnetically shielding between the elements and the overcoat layer 44 for protecting these elements, are mainly formed on the element-formed surface 31 that is one side when the ABS 30 of this slider substrate 210 is regarded as a bottom surface.

Figure 6:
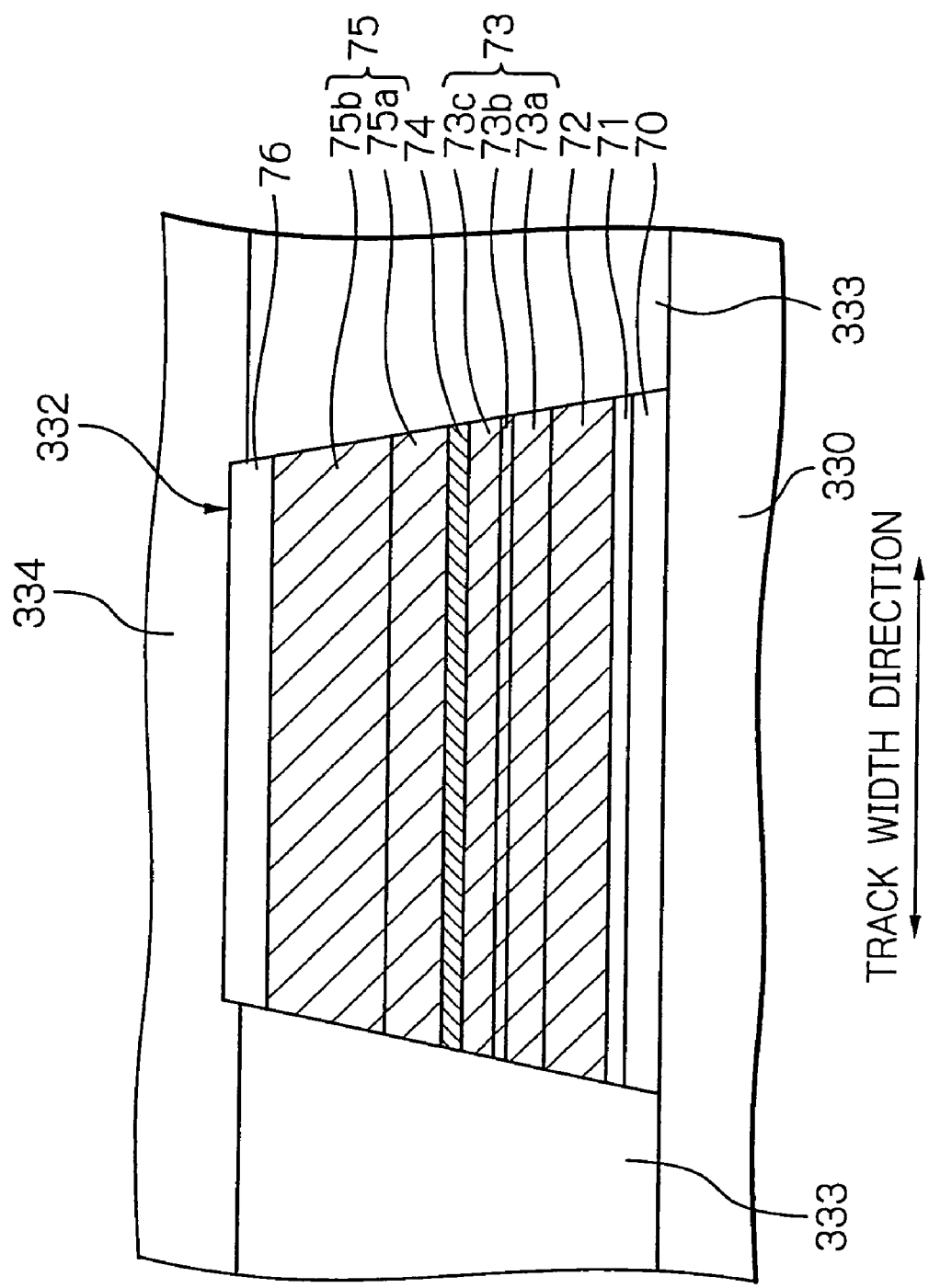
FIG. 6 shows a cross-section viewed from the head end face side schematically illustrating the layer structure of the TMR multilayer in FIG. 4.

The TMR effect element 33 includes a TMR multilayer 332, a lower electrode layer 330 and an upper electrode layer 334 arranged so as to sandwich this multilayer. The TMR multilayer 332 senses a signal field 45 from the magnetic disk 10 with very high sensitivity. The upper and lower electrode layers 334 and 330 also function as magnetic shields and prevent the TMR multilayer 332 from receiving an external magnetic field which becomes noise. The structure of the TMR multilayer 332 will be explained in more detail later (FIG. 6).

The inductive write head element 34 in this embodiment is for perpendicular magnetic recording and includes a main magnetic pole layer 340, an auxiliary magnetic pole layer 345, a main coil layer 343 and a backing coil layer 347. The main magnetic pole layer 340 is a magnetic path for converging and leading a magnetic flux induced by the main coil layer 343 and backing coil 347 to a perpendicular magnetic recording layer 101 of the magnetic disk 10 to which writing is performed. Here, the backing coil layer 347 is provided to prevent the disturbance of a recorded bit due to magnetization of the soft-magnetic backing layer 102 in the magnetic disk 10 and the noise at the reproduction output from increasing, however the backing coil layer 347 may also be omitted.

The main magnetic pole layer 340 is constructed of a main magnetic pole primary layer 3400 and a main magnetic pole auxiliary layer 3401. Here, the length (thickness) in the layer thickness direction of the main magnetic pole layer 340 at an end portion 340a on the head end face 300 side corresponds to the layer thickness of only this main magnetic pole primary layer 3400, which is small. As a result, it is possible to generate a fine write field corresponding to a higher recording density.

An end of the auxiliary magnetic pole layer 345 on the head end face 300 side constitutes a trailing shield portion 3450 having a larger layer cross section than other portions of the auxiliary magnetic pole layer 345. The trailing shield portion 3450 makes steeper the magnetic field gradient between an end portion 3450a of the trailing shield portion 3450 and the end portion 340a of the main magnetic pole layer 340. As a result, magnetization transition between the recorded bits is steepened and the jitter of the signal output decreases, making it possible to reduce an error rate during reading. The end portion 340a of the main magnetic pole layer 340 and the end of the trailing shield portion 3450 on the magnetic disk surface 10a side reach the head end face 300, and such as a diamond like carbon (DLC) is coated to the head end face 300 as an extremely thin protective film.

The magnetic disk 10 constitutes a perpendicular magnetic recording medium provided with the perpendicular magnetic recording layer 101 and soft-magnetic backing layer 102, considering that the inductive write head element is designed for perpendicular magnetic recording in this embodiment.

In this embodiment, the inductive write head element 34 and magnetic disk 10 are designed for perpendicular magnetic recording, however they may also be designed for conventional longitudinal magnetic recording.

FIGS. 5a to 5c show cross-sectional views taken along the line A-A in FIG. 3b illustrating manufacturing steps of the magnetic head element 32 in the embodiment in FIG. 4.

Hereinafter, the manufacturing steps of the thin-film magnetic head in this embodiment will be explained using the same figure. First, as shown in FIG. 5a, an insulating layer 40 having a thickness of approximately 0.05 to 10 μm made of $Al_2O_3$ is stacked on the slider substrate 210 formed of, for example, AlTiC ($Al_2O_3$—TiC) using, for example, a sputtering technique. Next, the lower electrode layer 330 having a thickness of approximately 0.3 to 3 μm made of, for example, NiFe, NiFeCo, CoFe, FeN or FeZrN is formed on the insulating layer 40 using, for example, a plating technique.

Next, the TMR multilayer 332 and insulating layer 333 are formed using, for example, a sputtering technique, photolithographic method and ion etching technique. The method of forming the TMR multilayer 332 and the insulating layer 333 will be explained in detail later.

Next, the upper electrode layer 334 having a thickness of approximately 0.3 to 4 μm made of, for example, NiFe, NiFeCo, CoFe, FeN or FeZrN is formed on the TMR multilayer 332 and insulating layer 333 using, for example, a plating technique and the formation of the TMR effect element 33 is completed. Next, a lower non-magnetic layer 41 having a thickness of approximately 0.1 to 2.0 μm made of, for example, $Al_2O_3$ is formed on the upper electrode layer 334 using, for example, a sputtering technique. Furthermore, the shielding-between-elements layer 42 having a thickness of approximately 0.3 to 4 μm made of, for example, NiFe, NiFeCo, CoFe, FeN or FeZrN is formed on the lower non-magnetic layer 41 using, for example, a sputtering technique. Then, an insulating film is formed of, for example, $Al_2O_3$ using, for example, a sputtering technique, and planarized using a chemical-mechanical polish (CMP) technique or the like. As a result, a planarized layer 50 is formed at a position on the opposite side to the head end face 300 of the TMR effect element.

Next, as shown in FIG. 5b, a first intermediate non-magnetic layer 3460 having a thickness of approximately 0.3 to 1.0 μm made of, for example, $Al_2O_3$ is formed on the shielding-between-elements layer 42 using, for example, a sputtering technique. Furthermore, the backing coil layer 347 having a thickness of approximately 0.5 to 3 μm made of, for example, Cu is formed on this first intermediate non-magnetic layer 3460 using, for example, a frame plating technique. Next, a first coil insulating layer 348 having a thickness of approximately 0.1 to 5 μm made of, for example, a cured resist layer is formed so as to cover this backing coil layer 347 and fill the gap between the coil layer patterns. Furthermore, a second intermediate non-magnetic layer 3461 having a thickness of approximately 0.3 to 1.0 μm made of, for example, $Al_2O_3$ is formed so as to cover this coil insulating layer 348 (and backing coil layer 347) using, for example, a sputtering technique. Then, a second intermediate non-magnetic layer 3461 is planarized using, for example, a CMP technique.

Next, as shown in FIG. 5c, the main magnetic pole primary layer 3400 having a thickness of approximately 0.01 to 0.5 μm made of, for example, an alloy composed of any two or three of Ni, Fe and Co or alloy made of these elements as principal components with predetermined elements added is formed using, for example, a puttering technique or plating technique, and the main magnetic pole auxiliary layer 3401 having a thickness of approximately 0.5 to 3 μm made of, for example, an alloy composed of any two or three of Ni, Fe and Co or alloy made of these elements as principal components with predetermined elements added is formed using likewise, for example, a sputtering technique or plating technique on the planarized second intermediate non-magnetic layer 3461.

Next, a gap layer 341 having a thickness of approximately 0.01 to 0.5 μm made of, for example, $Al_2O_3$ or DLC is formed on the main magnetic pole auxiliary layer 3401 using, for example, a sputtering technique, and then a second coil insulating layer 3440 having a thickness of approximately 0.1 to 5 μm, made of, for example, a cured resist layer is formed on the gap layer 341 and the main coil layer 343 having a thickness of approximately 0.5 to 3 μm made of, for example, Cu is formed on this second coil insulating layer 3440 using, for example, a frame plating technique. Furthermore, a third coil insulating layer 3441 having a thickness of approximately 0.1 to 5 μm made of, for example, a cured resist layer is formed so as to cover this main coil layer 343.

Furthermore, the auxiliary magnetic pole layer 345 having a thickness of approximately 0.5 to 5 μm made of, for example, an alloy composed of any two or three of Ni, Fe and Co or alloy made of these elements as principal components with predetermined elements added is formed so as to cover the third coil insulating layer 3441. Through the above described steps, the formation of the inductive write head element 34 is completed. Finally, after forming an insulating film made of, for example, $Al_2O_3$ so as to cover the TMR effect element 33 and inductive write head element 34, this insulating film is planarized using, for example, a CMP technique. As a result, the overcoat layer 44 is thereby formed and the formation of the magnetic head element 32 is completed.

FIG. 6 shows a cross-section viewed from the head end face 300 side in FIG. 4 schematically illustrating the layer structure of the TMR multilayer 332 that is the primary part of the TMR effect element 33 according to the embodiment in FIG. 4.

In the same figure, reference numeral 70 denotes a lower metal layer, 71 denotes a base layer, 72 denotes an antiferromagnetic layer, 73 denotes a pinned layer, 74 denotes a low-resistance tunnel barrier layer, 75 denotes a free layer and 76 denotes an upper metal layer. Here, the lower metal layer 70 is formed on the lower electrode layer 330 to electrically connect the TMR multilayer 332 to the lower electrode layer 330. Furthermore, the upper metal layer 76 on which the upper electrode layer 334 is formed electrically connects the TMR multilayer 332 to the upper electrode layer 334. Therefore, when a magnetic field is detected a sense current flows in a direction perpendicular to each layer surface in the TMR multilayer between the upper and lower electrode layers. Furthermore, the insulating layer 333 is formed so as to surround the MR multilayer 332.

At the position of the insulating layer 333 in FIG. 6, a side soft magnetic layer may also be provided to absorb a noise magnetic field from adjacent tracks on both sides in the track width direction of the pinned layer 73, the low-resistance tunnel barrier layer 74 and the free layer 75. In this case, the side insulating film is provided at a position below this side soft magnetic layer and at least at a position between the side soft magnetic layer and both ends in the track width direction of the pinned layer 73 and low-resistance tunnel barrier layer 74. This side insulating film makes it possible to at least avoid the sense current flowing without passing through the low-resistance tunnel barrier layer 74 and efficiently extract the TMR output.

Furthermore, it is also possible to provide a layer made of a hard magnetic material at the position of the insulating layer 333 on both sides in the track width direction of the pinned layer 73, the low-resistance tunnel barrier layer 74, the free layer 75, and interpose a thin insulating layer between this hard magnetic material layer and the TMR multilayer 332, so as to apply a hard bias magnetic field to the free layer 75. Or it is also possible to provide an in-stack bias multilayer consisting of a bias non-magnetic layer, a bias ferromagnetic layer and a bias antiferromagnetic layer, or other bias means, sequentially stacked between the free layer 75 and the upper metal layer 76. These bias means apply an exchange bias magnetic field to the free layer 75 and further promote a magnetic domain stabilization of the free layer 75.

The antiferromagnetic layer 72 is formed on the lower metal layer 70 via the base layer 71. The pinned layer 73 stacked on the antiferromagnetic layer 72 consists of a first ferromagnetic film 73a, a non-magnetic film 73b and a second ferromagnetic film 73c stacked sequentially on the antiferromagnetic layer 72, constituting a so-called synthetic ferromagnetic structure. An exchange bias magnetic field is applied to the first ferromagnetic film 73a due to an exchange coupling with the antiferromagnetic layer 72 and this stably fixes the magnetization of the entire pinned layer 73.

The structure of the low-resistance tunnel barrier layer 74 formed on the pinned layer 73 is an important point of the present invention and will be explained in detail later.

The free layer 75 staked on the low-resistance tunnel barrier layer 74 consists of a high polarizability film 75a and soft magnetic film 75b stacked in this order on this low-resistance tunnel barrier layer 74. The free layer 75 forms ferromagnetic tunnel coupling together with the pinned layer 73, using the low-resistance tunnel barrier layer as a barrier of tunnel effects. And the magnetization direction of the free layer 75 changes in response to a applied signal field. When the magnetization direction of the free layer 75 changes in response to the signal field, the tunnel current increases/decreases due to a variation in the density of state of up and down spin bands of the free layer 73, and as a result, the electric resistance of the TMR multilayer 332 changes. It is possible to detect a weak and local signal field reliably and with high sensitivity by measuring this resistance change. Here, the high polarizability film 75a is not always necessary and therefore omissible. When the high polarizability film 75a is omitted, a rate of resistance change equivalent to that of the soft magnetic film 75b existing in an interface with the low-resistance tunnel barrier layer 74 is realized.

In this way, the characteristic of the TMR effect element made up of the TMR multilayer is determined by the ferromagnetic tunnel coupled state and, in particular, influenced a great deal by the nature of the insulating layer as a tunnel barrier. Generally, the conventional TMR effect element has a higher element resistance value than other MR effect elements such as a GMR effect element. This is because for a conventional tunnel insulating (tunnel barrier) layer, the nature as a dielectric material is dominant and the resistance that the tunnel current receives becomes large.

On the contrary, the low-resistance tunnel barrier layer 74 according to this embodiment is formed so as to include many electric charge sites. Here, the electric charge site is a site involved in (or involving) trapping of electrons responsible for conductivity, or more specifically is an area adjacent to metal positive ions or metal atoms where electrons can be trapped.

Furthermore, metal positive ions or metal atoms that constitute the core of this electric charge site are in an oxidation-deficient state and the number of oxygen atoms (or ions) coordinated therearound is smaller than the original coordination number. Therefore, such metal positive ions or metal atoms positively generate oxygen defects. As a result, electrons are generated at the deficient positions to keep the overall electrical neutrality, and of these electrons and external electrons due to an applied voltage, electrons trapped at the deficient positions and emitted from the deficient positions become electric charge carriers. As described above, electric charge sites involve oxygen defects, and a structure where these oxygen defects are concentrated to a certain degree and thereby form much small voids, and another structure where pinholes or quasi-pinhole states are formed because the low-resistance tunnel barrier layer is an extremely thin layer, are also included in electric charge sites. However, when the pinned layer and the free layer contact each other at the deficient positions of the low-resistance tunnel barrier layer, the structure of this contact portion is not a pinhole according to the present invention and not included in electric charge sites.

As shown above, the low-resistance tunnel barrier layer 74 acquires the nature like an appropriate electric resistance element due to the existence of electric charge sites. As a result, the element resistance of the TMR multilayer 332 is sufficiently small compared to that of the conventional element. Note that the low-resistance tunnel barrier layer 74 can be in any one state of polycrystalline state, mono-crystalline state and amorphous state. The similar phenomenon and effect occur in all states.

Furthermore, the low-resistance tunnel barrier layer 74 is formed in such a way that assuming n (cm$^{-3}$) is a density of this electric charge site in the layer and μ (cm$^2$V$^{-1}$s$^{-1}$) is a mobility of an electron trapped due to this electric charge site, n and μ satisfy a conditional expression:

$$0<(n_{s1}^{-1}-n_{s2}^{-1})^{-1}\cdot(\mu_0-\mu)\cdot(n\mu)^{-1}<0.2 \quad (1)$$

which will be explained in detail later. Here, $n_{s1}$ and $n_{s2}$ (cm$^{-3}$) are densities of tunnel electrons corresponding to minimum and maximum outputs respectively, and $\mu_0$ (cm$^2$V$^{-1}$s$^{-1}$) is the mobility of an electron when there is no trapping.

In this way, the TMR effect element 33 provided with the TMR multilayer 332 has a sufficiently small element resistance, and further, the occurrence of popping noise in the element is limited to a degree that the popping noise does not constitute an impediment to reproduction output. As a result, the reduction of the cutoff frequency is prevented, high frequency which is essential to a high recording density can be easily realized, and in addition, not only the shot noise but also the popping noise is reduced, which assures an SN ratio of the element output available to an apparatus such as a magnetic disk drive apparatus.

The background of the present invention and the conditional expression (1) of n and μ in the above described electric charge site will be explained below.

The inventors of the present invention have analyzed details of the shot noise, the 1/f noise and the popping noise mainly observed at the output from the TMR effect element, and have successfully separated the popping noise into an output voltage caused by the magnetization state of the element and an electric popping output voltage.

Figure 7:
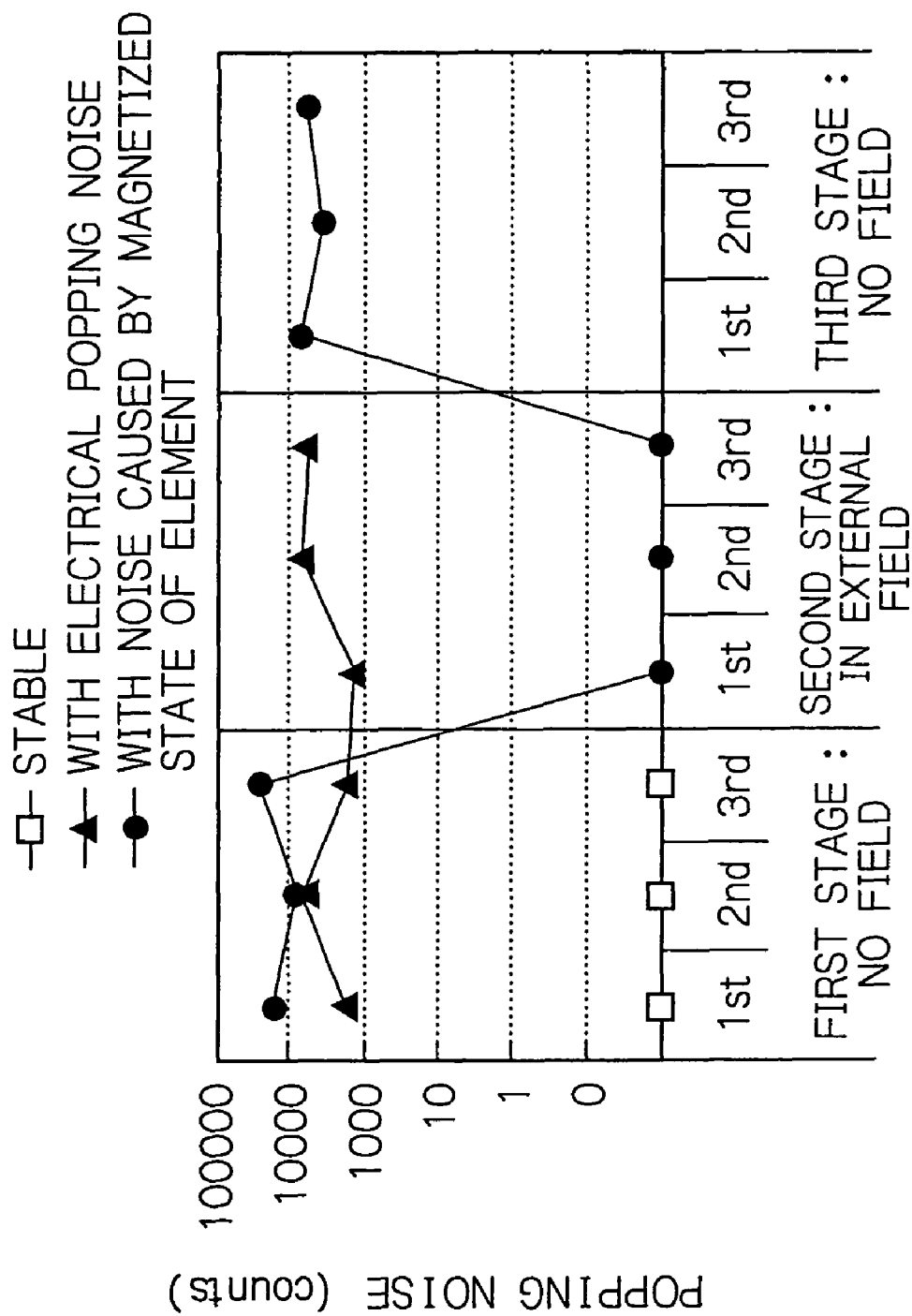
FIG. 7 shows a graph illustrating a method of separating the popping noise adopted by the inventors of the present invention.

FIG. 7 shows a graph illustrating a method of separating the popping noise adopted by the inventors of the present invention.

According to FIG. 7, the separation of the noise is realized in three stages. In a first stage, the popping noise generated at the output voltage of the thin-film magnetic head provided with a TMR effect element is counted for 5 seconds with no external magnetic field. More specifically, a voltage 1.2 times a root-mean-square value of the output voltage of the head with no signal field from a recording medium under flowing a sense current is defined to be a threshold for counting of the popping output voltage. Voltages exceeding this threshold within a measurement time of 5 seconds are counted. This operation is repeated three times to improve the certainty of the count data. Here, when no popping noise is observed, the tested thin-film magnetic head is evaluated as a stable element with no popping noise. On the other hand, when the popping noise is observed, the tested thin-film magnetic head moves to the next second stage.

In the second stage, when an external magnetic field of 6 kOe (approximately 480 kA/m) is applied to the thin-film magnetic head, the popping noise generated at the output voltage of this thin-film magnetic head is counted as in the case of the first stage. Here, when the popping noise is no longer observed, the popping noise observed in the previous first stage is assumed to be a noise derived from the magnetization state of the element. This classification is based on the fact that Barkhausen noise or the like caused by a magnetic domain wall movement disappears when the magnetization within the element is saturated through application of an external magnetic field. On the other hand, when the popping noise is still observed, this popping noise is assumed not to be derived from the magnetization state of the element, but to be electric.

Next, in the third stage, to confirm reproducibility of the popping noise, the popping noise is counted with no external magnetic field as in the case of the first stage. When the popping noise is observed here as in the case of the second stage, this popping noise is confirmed to be electric. When the popping noise that has not been observed in the second stage is observed, this popping noise is confirmed to be derived from the magnetization state of the element.

Furthermore, the inventors of the present invention have assumed that the above-described electric popping noise is the electric popping output voltage to be controlled, and have discovered that the electric popping output voltage in the TMR effect element is related to the electric charge sites that exist within the tunnel insulating layer.

Figure 8:
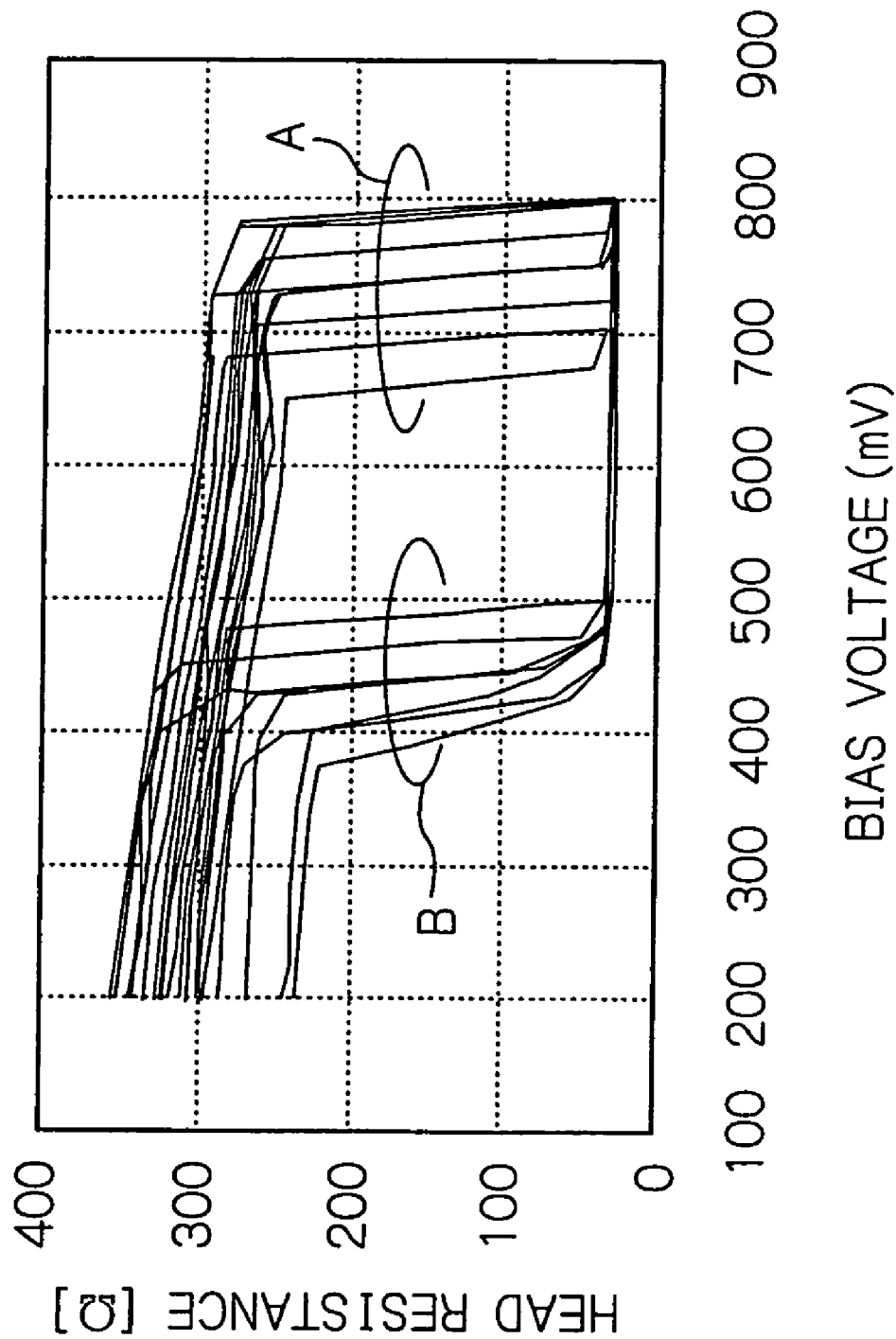
FIG. 8 shows a graph illustrating the result of a withstand voltage test conducted about a plurality of thin-film magnetic heads provided with a TMR effect element.
Figure 9:
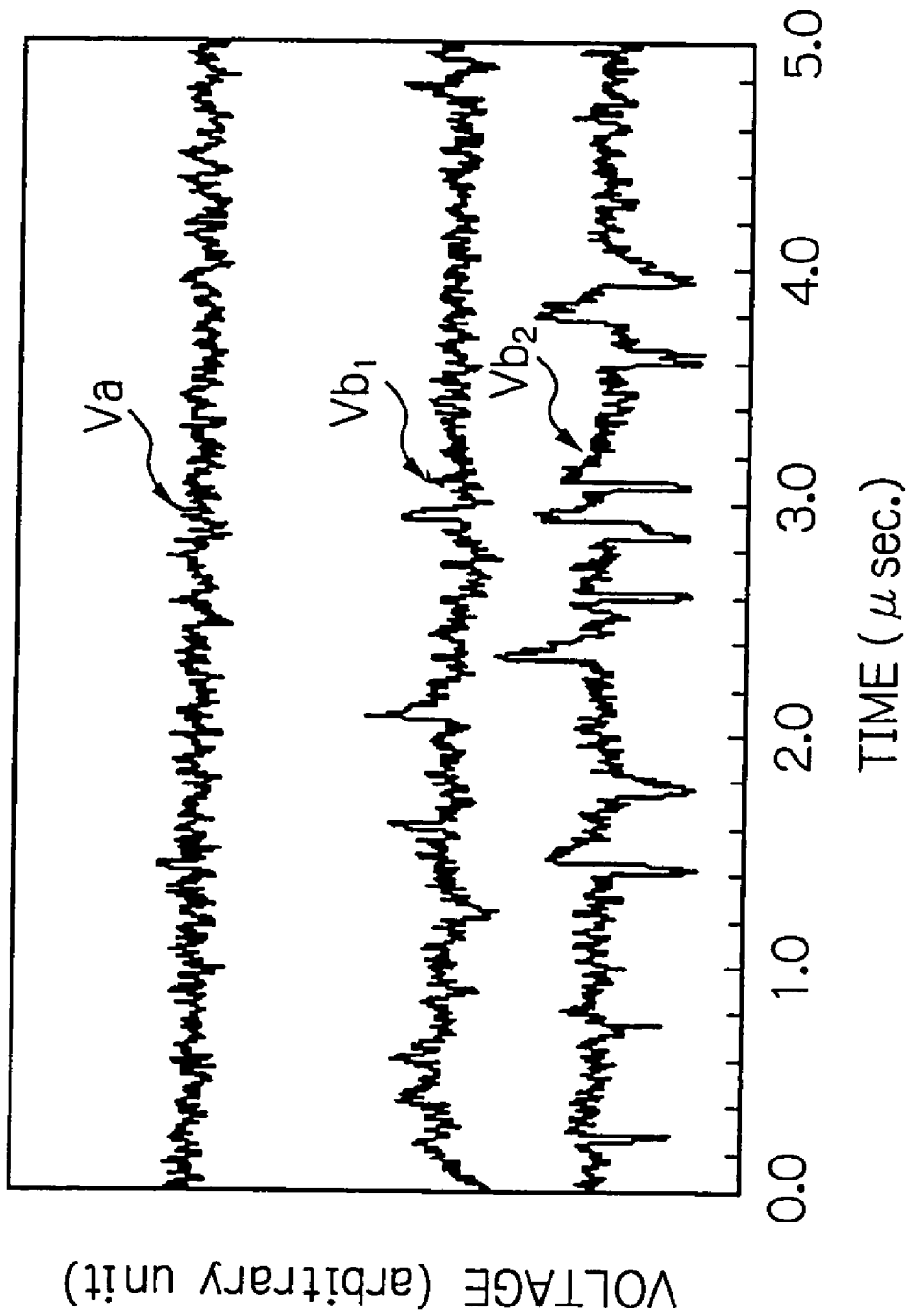
FIG. 9 shows a graph illustrating output voltage patterns of the thin-film magnetic head.
Figure 10:
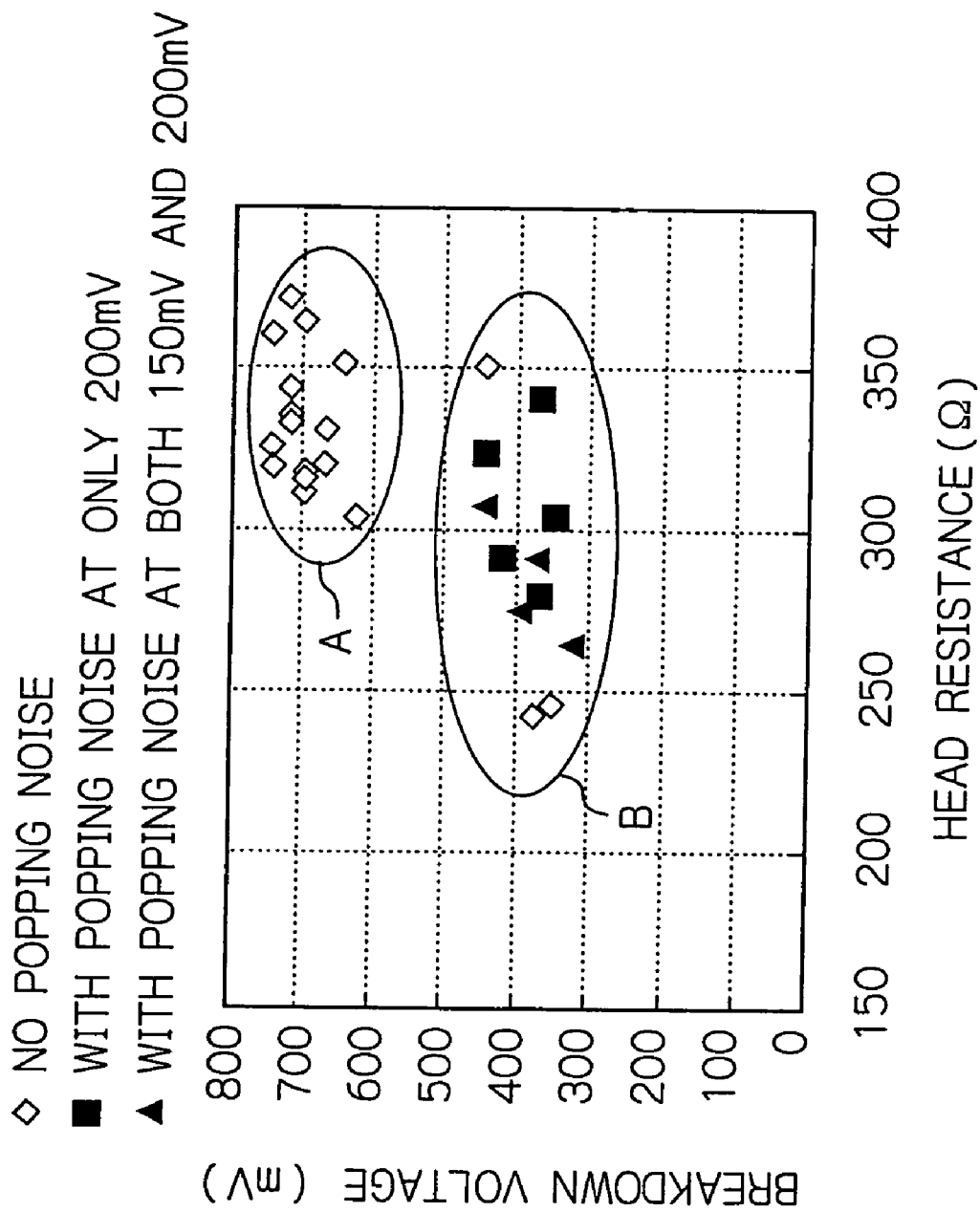
FIG. 10 shows a graph illustrating a relationship between the electric popping output voltage and dielectric breakdown voltage.

FIG. 8 shows a graph illustrating the result of a withstand voltage test conducted about a plurality of thin-film magnetic heads provided with a TMR effect element. Here, the product RA of the resistance value of each TMR effect element in the layer thickness direction and the area of the layer is 4.0 Ωμm$^2$ and the tunnel junction area is 0.11×0.11 μm$^2$. Furthermore, FIG. 9 shows a graph illustrating output voltage patterns of the thin-film magnetic head. Here, during the output voltage measurement, a bias voltage of 150 mV is applied with an external magnetic field of 6 kOe (approximately 480 kA/m) applied. Furthermore, FIG. 10 shows a graph illustrating a relationship between the electric popping output voltage and dielectric breakdown voltage.

According to FIG. 8, the value of the dielectric breakdown voltage is clearly divided into two groups. It is known that group A corresponds to a case where there is no electric charge site within the tunnel insulating layer and group B corresponds to a case where there are electric charge sites.

According to FIG. 9, no popping output voltage appears in an output voltage pattern $V_a$, while electric popping output voltages are observed in output voltage patterns $V_{b1}$ and $V_{b2}$. Such electric popping output voltages are observed only at the thin-film magnetic head that belongs to group B whose dielectric breakdown voltage is smaller as shown in FIG. 10. Therefore, it is understandable that the electric popping output voltage is caused by electric charge sites within the tunnel insulating layer. Here, the resistance value of the thin-film magnetic head decreases as the number of electric charge sites increases, but the occurrence frequency of the electric popping output voltage increases.

Based on the results of the above described experimental works, the inventors of the present invention assumed that it would be possible to obtain a TMR effect element with the element resistance sufficiently reduced and with the generation of popping noise restricted. As a result, the inventors of the present invention have come up with the present invention that positively forms electric charge sites within a tunnel barrier layer, though limiting the electric charge sites so that the electric popping output voltage is reduced to a degree not causing an adverse effect on the element output. Furthermore, the inventors of the present invention have come up with the present invention characterized by testing and manufacturing a TMR effect element using the popping noise separation method shown in FIG. 7.

Here, the conditional expression (1) of the density n of electric charge site and the mobility µ of trapped electrons will be explained.

Specific resistance ρ is generally expressed by:

$$\rho = (n_e e \mu)^{-1} \quad (2)$$

where e is electric charge of electrons responsible for conductivity, $n_e$ is a density and µ is a mobility. In the case of the electric popping output voltage caused by trapping of electrons due to electric charge sites, the density $n_e$ of a maximum number of electrons contributing to one pulse of noise becomes the density n of electric charge sites. Here, the number of electric charge sites is determined by the size, shape and various conditions at the formation of a tunnel barrier layer, and therefore the electric charge site density n takes a constant value after the formation of the layer. Furthermore, the electric popping output voltage generated due to the existence of electric charge sites is provoked by an instantaneous variation of the mobility of trapped electrons. That is, when electrons pass through a tunnel barrier layer, the difference between mobilities when the electrons are trapped in the electric charge sites and when the electrons are not trapped provokes an electric popping output voltage.

Figure 11A:
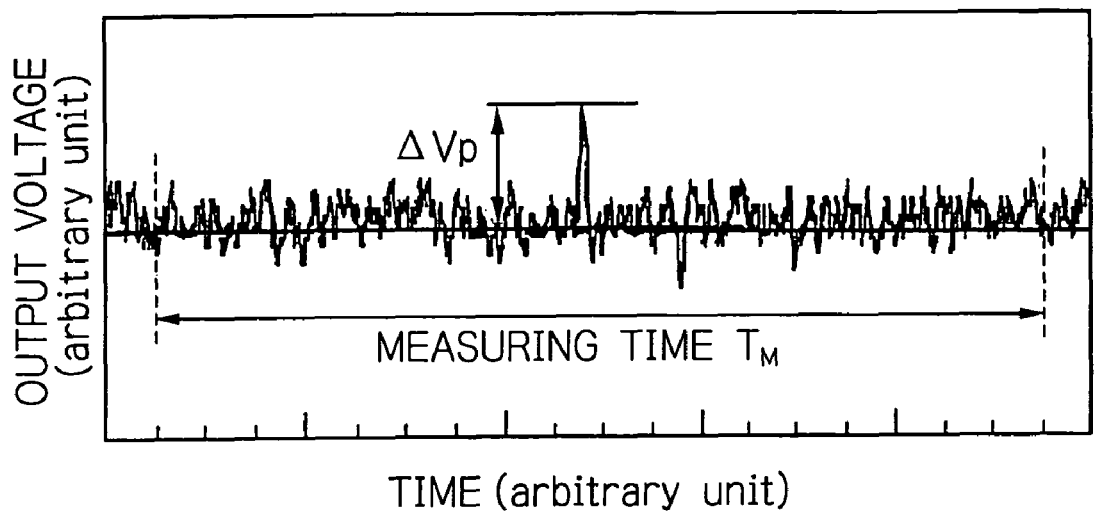
FIG. 11a shows a characteristic graph illustrating an element output as a measurement example of an electric popping output voltage to define the electric popping output voltage $\Delta V_P$.

Here, for the following explanations, the electric popping output voltage $\Delta V_P$ and element output voltage $\Delta V_S$ during reading by the TMR effect element will be defined clearly. FIG. 11a shows a characteristic graph illustrating an element output as a measurement example of an electric popping output voltage to define the electric popping output voltage $\Delta V_P$. Furthermore, FIG. 11b shows a characteristic graph illustrating the relationship between the element resistance MRR and applied magnetic field to define the element output voltage $\Delta V_S$.

In FIG. 11a, the electric popping output voltage $\Delta V_P$ is defined as a maximum absolute value of the difference between a voltage value at a output peak position and the reference voltage value out of electric popping outputs observed during a measuring time $T_M$. That is, $\Delta V_P$ corresponds to a maximum value of the heights of peaks and depths of valleys of the electric popping output. On the other hand, in FIG. 11b, a maximum value of the popping output when the element resistance value is $MRR_P$ is above described $\Delta V_P$ ($\Delta V_P/I$ when converted to a resistance value assuming that the current is I). Here, $MRR_P$ is an element resistance value when an external magnetic field is applied to each head, which causes the orientation of magnetization of the free layer to match the orientation of magnetization of the pinned layer.

Note that the measuring time $T_M$ needs to be at least 5 µsec to guarantee the certainty of the popping output count. Naturally, it may be a time longer than 5 µsec, for example, on the order of 200 µsec.

Figure 11B:
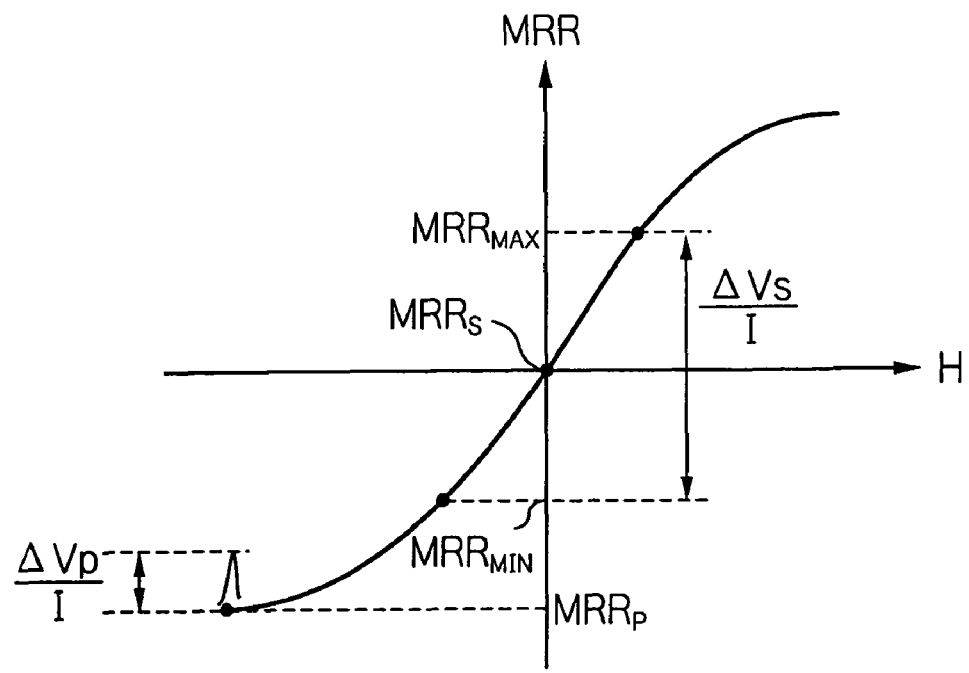
FIG. 11b shows a characteristic graph illustrating the relationship between the element resistance MRR and applied magnetic field to define the element output voltage $\Delta V_S$.

On the other hand, when the element output voltage $\Delta V_S$ ($\Delta V_S/I$ when converted to a resistance value assuming that the current is I) during reading by the TMR effect element is the difference between a maximum value of the element resistance $MRR_{MAX}$ and minimum value of the element resistance $MRR_{MIN}$, centered on the element resistance value $MRR_S$ in FIG. 11b. Here, $MRR_S$ is an element resistance value in a non-magnetic field.

Based on the above described definition, physical contents of $\Delta V_P$ and $\Delta V_S$ will be discussed below. Assuming that the specific resistance and mobility when electrons are trapped in a tunnel barrier layer are $\rho_{P1}$ and µ and the specific resistance and mobility when electrons are not trapped are $\rho_{P2}$ and $\mu_0$, the electric popping output voltage $\Delta V_P$ is expressed using the expression (2) as:

$$\Delta V_P = (\rho_{P1} - \rho_{P2}) \cdot l/S \cdot I \quad (3)$$
$$= ((ne\mu_0)^{-1} - (ne\mu)^{-1}) \cdot l/S \cdot I$$

where S is the layer area of the tunnel barrier layer and l is the thickness of the layer and I is the current value.

On the other hand, the element output voltage $\Delta V_S$ during reading by the TMR effect element is generated when the difference between the densities of states at a Fermi level of up spin electrons and down spin electrons derived from polarizability of the pinned layer and the free layer generates a resistance variation. That is, the element output voltage $\Delta V_S$ can be expressed as a variation in the density of electrons responsible for conductivity. Here, the mobility of tunnel electrons is determined by a layer thickness 1 of the tunnel barrier layer or the like and is equal to the above described mobility $\mu_0$ when electrons are not trapped.

Here, suppose the specific resistance and the density of tunnel electrons when the element resistance is a minimum during reading signals are $\rho_{S1}$ and $n_{S1}$ respectively and the specific resistance and the density of tunnel electrons when the element resistance is a maximum are $\rho_{S2}$ and $n_{S2}$ respectively. Then, the element output voltage $\Delta V_S$ is expressed by:

$$\Delta V_S = (\rho_{S2} - \rho_{S1}) \cdot l/S \cdot I \quad (4)$$
$$= ((n_{S2} e \mu_0)^{-1} - (n_{S1} e \mu_0)^{-1}) \cdot l/S \cdot I$$

Next, the allowable range of the electric popping output voltage $\Delta V_p$ will be explained.

Figure 12:
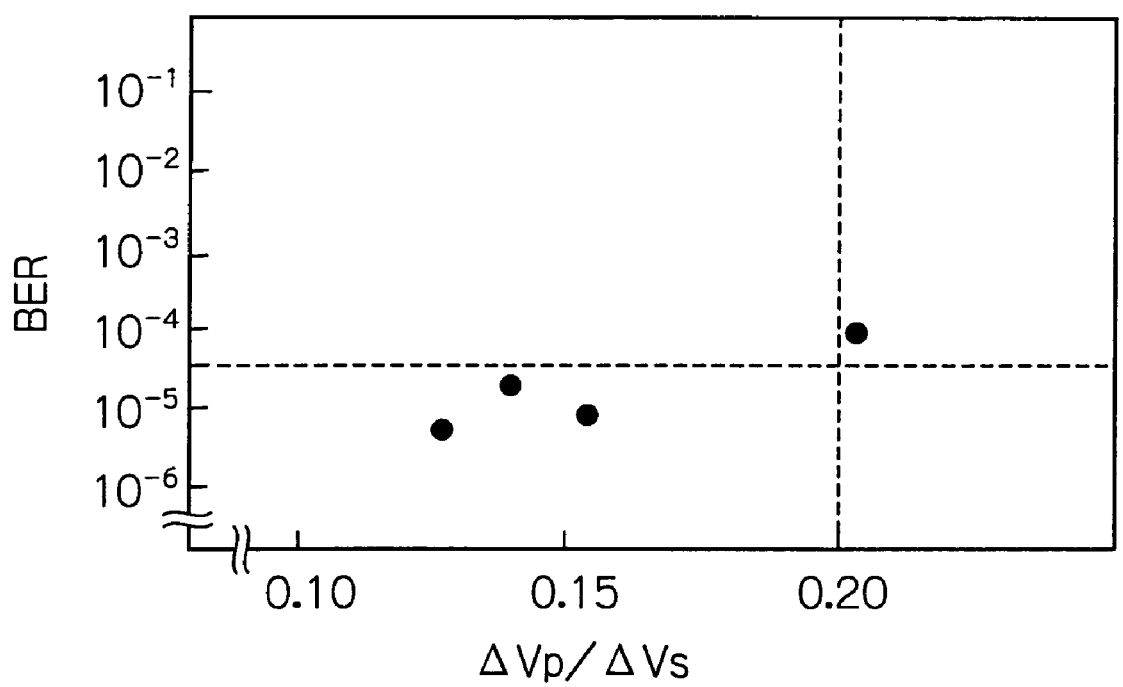
FIG. 12 shows a relationship between the results of $\Delta V_P/\Delta V_S$ and the measurement results of BER in Table 1.

Table 1 shows measurement results of the output voltage of electric popping noise $\Delta V_P$ and element output voltage $\Delta V_S$, and bit error rate (BER) during a data read as an embodiment of four thin-film magnetic heads. Furthermore, FIG. 12 is a graph between $\Delta V_P/\Delta V_S$ and BER in the measurement results shown in Table 1.

TABLE 1

| head | $MRR_P$ (ohm) | $MRR_S$ (ohm) | $\Delta V_P$ (mV) | $\Delta V_S$ (mV) | $\Delta V_P/\Delta V_S$ | nµ (C ohm cm)$^{-1}$ | n$\mu_0$ (C ohm cm)$^{-1}$ | $n_{S1}\mu_0$ (C ohm cm)$^{-1}$ | $n_{S2}\mu_0$ (C ohm cm)$^{-1}$ | BER |
|---|---|---|---|---|---|---|---|---|---|---|
| H1 | 230.8 | 261.5 | 0.430 | 3.35 | 0.128 | $2.70 \times 10^{19}$ | $2.70 \times 10^{19}$ | $2.41 \times 10^{19}$ | $2.36 \times 10^{19}$ | $10^{-5.3}$ |
| H2 | 239.5 | 264.4 | 0.433 | 3.11 | 0.139 | $2.61 \times 10^{19}$ | $2.60 \times 10^{19}$ | $2.39 \times 10^{19}$ | $2.34 \times 10^{19}$ | $10^{-4.8}$ |
| H3 | 223.6 | 248.2 | 0.529 | 3.42 | 0.155 | $2.79 \times 10^{19}$ | $2.78 \times 10^{19}$ | $2.54 \times 10^{19}$ | $2.49 \times 10^{19}$ | $10^{-5.1}$ |
| H4 | 232.9 | 253.1 | 0.744 | 3.66 | 0.203 | $2.68 \times 10^{19}$ | $2.67 \times 10^{19}$ | $2.50 \times 10^{19}$ | $2.44 \times 10^{19}$ | $10^{-4.1}$ |

Table 1 shows measurement results of $MRR_P$, $MRR_S$, $\Delta V_P$ and $\Delta V_S$ one by one from the left. Furthermore, Table 1 also shows values of $n\mu$, $n\mu_0$, $n_{S1}\mu_0$ and $n_{S2}\mu_0$ together which are calculated from these measured values using the expression (2). Furthermore, Table 1 also shows measurement results of BER during reading by each head in the rightmost. According to Table 1, element resistance values $MRR_P$ and $MRR_S$ at the four heads H1, H2, H3 and H4 are within ranges of 223.6 to 239.5 ohm and 248.2 to 264.4 ohm respectively and element output voltage $\Delta V_S$ is within a range of 3.11 to 3.66 mV. That is, it is appreciated that these four heads are heads on the same level with no significant differences with respect to the element resistance and element output.

FIG. 12 shows a relationship between the results of $\Delta V_P/\Delta V_S$ and the measurement results of BER in Table 1. According to FIG. 12, though these four heads have element resistances and element outputs on the same level as described above, the BER exceeds $10^{-4.5}$ only with the head H4 whose $\Delta V_P/\Delta V_S$ value is 0.2 or above.

Here, in actual manufacturing fields, heads whose BER measured under the same measuring conditions is $10^{-4.5}$ or below are regarded as non-defective products on experience. Therefore, as the upper limit of the allowable range of the electric popping output voltage $\Delta V_P$, it is obvious that the $\Delta V_P/\Delta V_S$ value is required to be less than 0.2.

On the other hand, since there is also a TMR effect element that belongs to the low dielectric breakdown voltage group and generates almost no electric popping output voltage though having electric charge sites, a lower limit value of the electric popping output voltage $\Delta V_P$ becomes a finite value, that is, the value exceeding 0% of the signal output. Therefore, $$0 < \Delta V_P/\Delta V_S < 0.2 \quad (5)$$

becomes the conditional expression.

Using the expressions (3) and (4), $\Delta V_P/\Delta V_S$ becomes $$\Delta V_P/\Delta V_S = ((ne\mu_0)^{-1} - (ne\mu)^{-1}) \cdot ((n_{S2}e\mu_0)^{-1} - (n_{S1}e\mu_0)^{-1})^{-1} \quad (6)$$
$$= (n_{S1}n_{S2}\mu_0(\mu - \mu_0)) \cdot (n(n_{S1} - n_{S2})\mu\mu_0)^{-1}$$

and therefore, from the expressions (5) and (6), the above described conditional expression:

$$0 < (n_{s1}^{-1} - n_{s2}^{-1})^{-1} \cdot (\mu_0 - \mu) \cdot (n\mu)^{-1} < 0.2 \quad (1)$$

is induced.

Therefore, when the density n of electric charge site and the mobility μ of trapped electrons satisfy the conditional expression (1), the element resistance is sufficiently small and can be limited to a degree that the generation of popping noise does not constitute any impediment to reproduction.

FIGS. 13a to 13d show cross-sectional views illustrating a part of steps of forming the TMR multilayer 332 in the embodiment in FIG. 4 and show cross sections viewed from the head end face 300 side in FIG. 4 as in the case of FIG. 6.

Figure 13A:
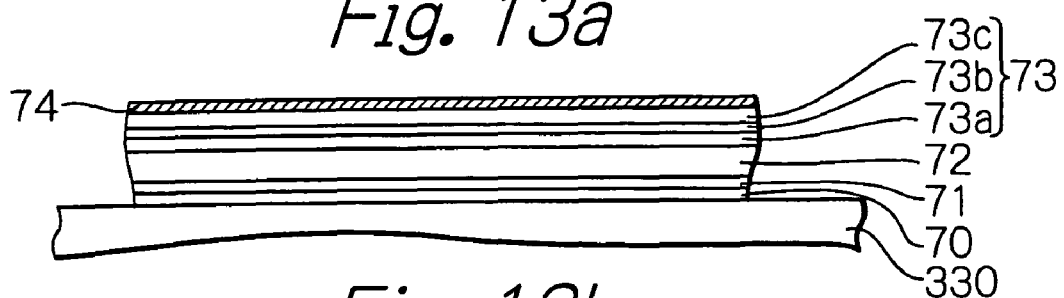
FIGS. 13a to 13d show cross-sectional views illustrating a part of steps of forming the TMR multilayer in the embodiment in FIG. 4 and show cross sections viewed from the head end face side.

As shown in FIG. 13a, the lower electrode layer 330 having a thickness of approximately 2 μm made of, for example, NiFe is formed on an insulating layer (not shown) formed on a slider substrate (not shown) using a technique of plating or the like. Next, the lower metal layer 70 having a thickness of approximately 5 nm made of, for example, Ta, Hf, Nb, Zr, Ti, Mo or W, the base film 71 having a thickness of approximately 5 nm made of, for example, NiFe or NiCr, the antiferromagnetic layer 72 having a thickness of approximately 5 to 15 nm made of, for example, PtMn, NiMn, IrMn, RuRhMn, the first ferromagnetic film 73a having a thickness of approximately 2 nm made of, for example, CoFe, the non-magnetic film 73b having a thickness of approximately 0.8 nm made of an alloy composed of one, two or more of Ru, Rh, Ir, Cr, Re and Cu, and the second ferromagnetic film 73c having a thickness of approximately 3 nm made of, for example, CoFe are formed on the insulating layer sequentially using, for example, a sputtering technique.

Next, a metal film having a thickness of approximately 0.5 to 0.6 nm made of, for example, Al is formed on the formed second ferromagnetic film 73c using, for example, a sputtering technique. Next, this metal film is oxidized in a gas atmosphere containing one, two or more of oxygen molecules, oxygen atoms, oxygen ions, ozone ($O_3$) and dinitrogen oxide ($N_2O$) introduced into a vacuum device, and becomes the low-resistance tunnel barrier layer 74. Of these gases for oxidation, $O_3$ and $N_2O$ in particular have greater molecular weights than oxygen, generate more oxygen defects than when a normal oxygen gas is used, and can form a layer including more electric charge sites consequently. When $N_2O$ is actually used, by setting the $N_2O$ partial pressure to 0.1 to 1 kPa, the flow rate of $N_2O$ to 200 to 1000 sccm and adjusting the oxidation time in accordance with RA (the product of the resistance value in layer thickness direction and the layer area), the amount of oxygen defects increases 50 to 100% of that in the case where a normal oxygen gas is used. Furthermore, in an atmosphere including oxygen molecules, oxygen atoms and oxygen ions, it is also possible to form oxygen defects sufficiently by controlling the partial pressures of these components, temperature of the metal layer or the like.

Here, the metal film may also be a metal or an alloy made of one, two or more of Al, Ti, Mg, Hf, Zr, Si, Ta, Mo and W, or an alloy in which one, two or more elements of Fe, Ni, Cr, Mn, Co, Rh, Pd, Cd, Ir, Zn, Ba, Ca, Li, Na, K and P, having a lower oxidation free energy level than the metal or the alloy is added to the metal or the alloy. These added elements having a lower oxidation free energy level are likely to become metal positive ions or metal atoms contributing to the formation of electric charge sites in the tunnel barrier layer. That is, an addition of these elements makes it possible to positively form electric charge sites in the layer.

Figure 13B:
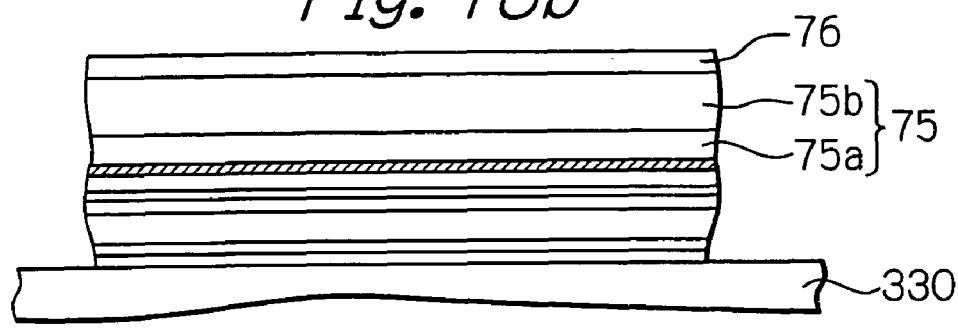

Next, as shown in FIG. 13b, the high polarizability film 75a having a thickness of approximately 1 nm made of, for example, CoFe, the soft magnetic film 75b having a thickness of approximately 3 nm made of, for example, NiFe, the upper metal layer 76 having a thickness of approximately 16 nm made of, for example, Ta, Hf, Nb, Zr, Ti, Mo or W are formed on the formed low-resistance tunnel barrier layer 74 sequentially using, for example, a sputtering technique.

Though not shown, when an in-stack bias multilayer is provided between the free layer 75 and upper metal layer 76 as described above, a bias non-magnetic layer having a thickness of approximately 1 nm made of an alloy composed of one, two or more of, for example, Ta, Hf, Nb, Zr, Ti, Mo, W, Ru, Rh, Ir, Cr, Re, Cu, Pt, Au, Ag, Al and Si, a bias ferromagnetic layer having a thickness of approximately 5 nm made of, for example, CoFe and a bias antiferromagnetic layer having a thickness of approximately 7 nm made of, for example, IrMn are stacked on the soft magnetic film 75b sequentially using, for example, a sputtering technique.

Figure 13C:
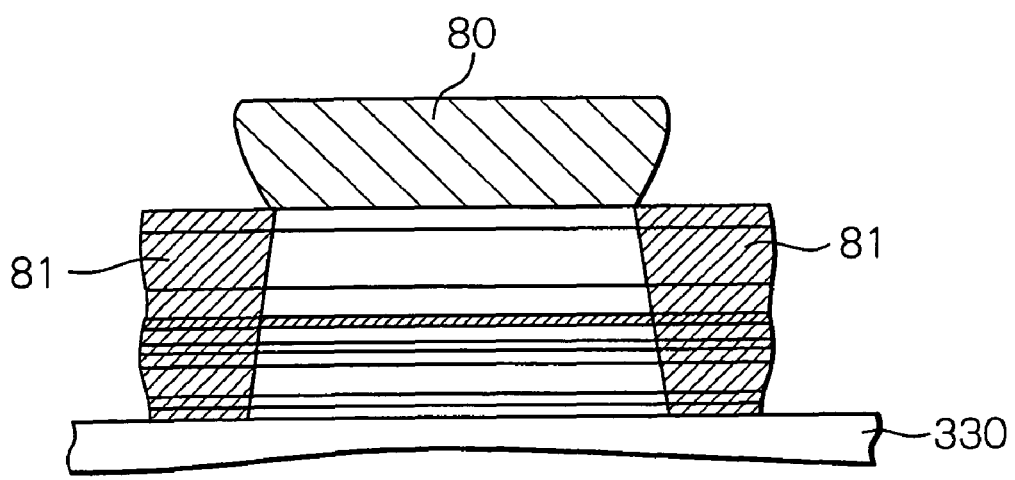
Figure 13D:
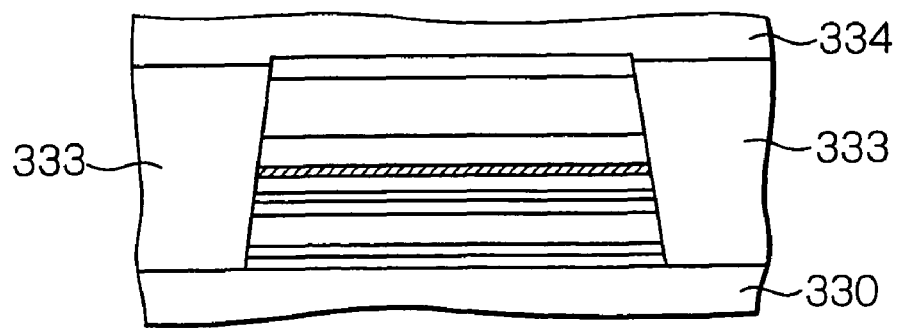

Next, as shown in FIG. 13c, a photoresist layer for lift off or the like is exposed to light and developed, and thereby a photoresist pattern 80 is formed on the upper metal layer 76 (or bias antiferromagnetic layer). Area 81 shown with hatching in FIG. 13c is removed using an ion milling technique or the like using this photoresist pattern 80 as a mask. Next, an insulating film made of, for example, $Al_2O_3$ is formed on this using, for example, a sputtering technique and the insulating layer 333 having a thickness of approximately 30 nm is formed using a lift off technique for removing the photoresist pattern 80 as shown in FIG. 13d. Furthermore, the upper electrode layer 334 having a thickness of approximately 2 μm made of, for example, NiFe is formed on this using a technique such as plating.

Though not shown, when a hard bias means is provided at the position of the insulating layer 333, after the above ion milling processing as described above, an insulating film having a thickness of approximately 5 to 15 nm made of, for example, $Al_2O_3$ is formed using, for example, a sputtering technique first and then a hard magnetic layer made of, for example, CoPt or CoCrPt is stacked. Next, hard bias means is formed at the position of the insulating layer 333 using a lift off technique of removing the photoresist pattern 80.

When a side soft magnetic layer instead of the hard bias means is provided at the position of the insulating layer 333 as described above, the side soft magnetic layer is formed in the same way. However, the side soft magnetic layer is constructed of a soft magnetic material made of, for example, NiFe. Furthermore, the side insulating film is made of an insulating material such as $Al_2O_3$.

The material and the thickness of the antiferromagnetic layer 72, pinned layer 73 and free layer 75 in this embodiment are not limited to those described above, but various materials and thicknesses can be used. Furthermore, for the pinned layer 73, not only the three-layer structure composed of three films but also a single layer structure made up of a ferromagnetic film or a multilayer structure having the different number of layers can be used. Moreover, for the free layer 75, it is also possible to adopt a single layer structure without any high polarizability film 444a or a multilayer structure having three or more layers including a magnetic distortion adjustment film in addition to the double layer structure.

FIG. 14a shows a flow chart schematically illustrating an embodiment of the manufacturing method of a thin-film magnetic head according to the present invention and FIG. 14b shows a flow chart schematically illustrating another embodiment of the manufacturing method.

According to FIG. 14a, first, the lower electrode layer is formed on the element-formed surface of the slider wafer substrate (step S1), then the pinned layer of the TMR multilayer is formed (step S2), then the low-resistance tunnel barrier layer of the TMR multilayer is formed (step S3), then the free layer of the TMR multilayer is formed (step S4) and furthermore, the upper electrode layer is formed (step S5) and the TMR effect element is thereby completed. Next, after the shielding-between-elements layer is formed (step S6), the inductive write head element is formed (step S7), the overcoat layer and signal electrodes are formed (step S8) and then the wafer substrate steps are completed.

Next, the wafer substrate for which the above-described steps are completed is cut into row bars on which a plurality of magnetic head elements are aligned (step S9). Next, in order to obtain a desired MR height, polishing this row bar for adjusting MR height is performed (step S10).

Here, the thin-film magnetic head according to the present invention is provided with a low-resistance tunnel barrier layer, and low element resistance is realized by forming and controlling electric charge sites in the layer in the low-resistance tunnel barrier layer formation step (step S3). In order to confirm that the thin-film magnetic head has low resistance and the electric popping output voltage is limited and to select the thin-film magnetic head meeting the conditions, a selecting step (step $S_S$) is performed after the rapping for adjusting MR height (step S10). This selecting step is intended to select only the thin-film magnetic head for which the electric popping output voltage is within a predetermined range through testing and will be explained in detail later (FIG. 16). Then, the row bar subjected to the rapping for adjusting MR height is cut and separated into individual sliders (thin-film magnetic heads) (step S11) and manufacturing steps of the thin-film magnetic head is thereby completed.

As shown in FIG. 14b, this selecting step (step $S_S$) may also be performed after the cutting and separation into sliders (step S11'). Furthermore, this selecting step (step $S_S$) may also be performed after completing the respective steps of forming the upper electrode layer in FIG. 14a (step S5) to forming the row bar (step S9). In any case, the upper and lower electrode layers are already formed, and therefore a bias voltage for testing can be applied. Furthermore, it is also possible to mount the sliders formed using the manufacturing method in steps S1 to 11 on the suspension, form an HGA and perform the selecting step.

FIG. 15 shows a perspective view schematically illustrating a part of the structure of the testing apparatus that inspects (selects) the thin-film magnetic head (TMR effect element) according to the present invention.

Figure 15A:
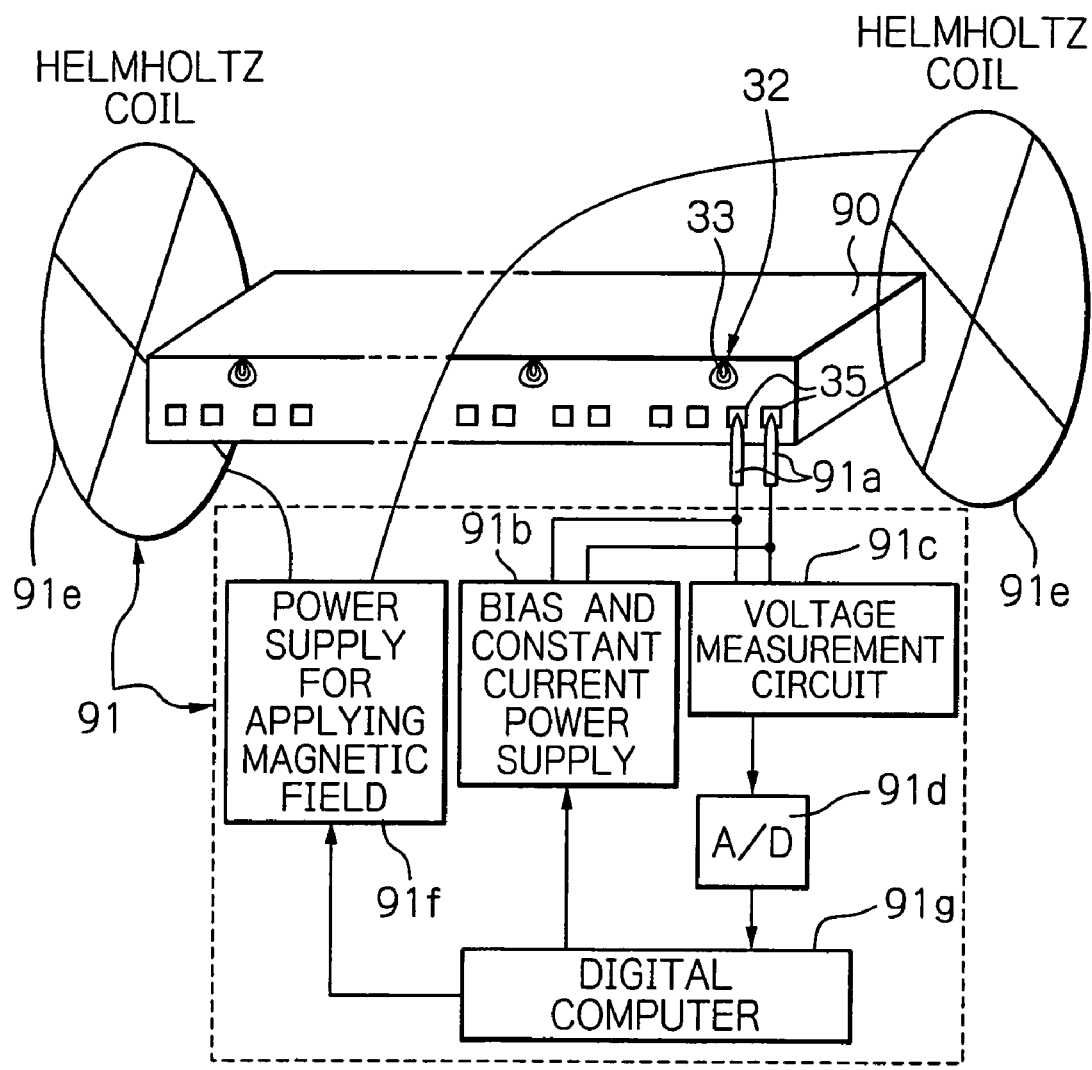
FIG. 15 shows a perspective view schematically illustrating a part of the structure of the testing apparatus that selects the thin-film magnetic head according to the present invention.

According to FIG. 15a, reference numeral 90 denotes a row bar on which a plurality of thin-film magnetic heads are concatenated with one another and aligned, and reference numeral 91 denotes an testing apparatus.

The row bar 90 is obtained by cutting and separating a slider wafer substrate made up of many magnetic head elements into individual row bars and then performing rapping for adjusting MR height. Each magnetic head element 32 of the row bar 90 is provided with a TMR effect element 33 and a pair of signal electrodes 35 electrically connected to this TMR effect element 33.

The testing apparatus 91 is provided with a pair of probes 91a electrically contactable to the pair of signal electrodes 35 for the TMR effect element, a bias and constant current power supply 91b electrically connected to this pair of probes 91a for supplying a bias voltage or sense current, a voltage measurement circuit 91c electrically connected to the pair of probes 91a for measuring the value of a voltage output from the TMR effect element 33, an A/D converter 91d electrically connected to the voltage measurement circuit 91c for converting an analog output that is the measured output voltage to a digital signal, a Helmholtz coil 91e which can apply a direct magnetic field enough to magnetically saturate the TMR effect element 33 to the row bar 90, a direct magnetic field power supply 91f to drive the Helmholtz coil 91e and a digital computer 91g electrically connected to the A/D converter 91d, which continuously inputs the digital signal, extracts popping noises generated in the element output voltage of the TMR effect element, calculates the popping output voltage, and determines the quality of the TMR effect element, and controls the operations of the bias and constant current power supply 91b, the A/D converter 91d and the direct magnetic field power supply 91f.

Figure 15B:
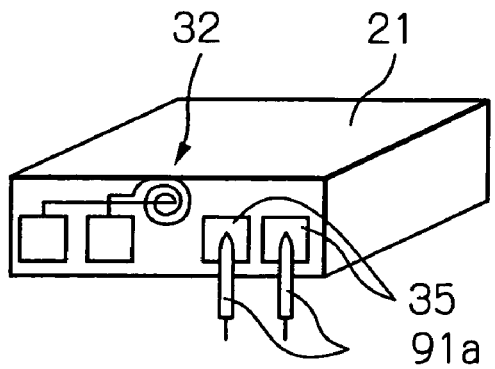

According to FIG. 15b, as an alternative concerning an object to be tested, the row bar 90 is cut and separated into individual magnetic head sliders 21 and the testing is performed with the pair of probes 91a electrically contacted to the pair of signal electrodes 35 of the TMR effect element 32. The rest of the configuration, operation and effects of the testing apparatus are the same as those in FIG. 15a.

FIG. 16 shows a flow chart schematically illustrating the selecting step (testing method) of the thin-film magnetic head according to the present invention.

First, the application of a saturation direct magnetic field to the row bar 90 (FIG. 15) using the Helmholtz coil 91e is started (step $S_S1$). This saturation direct magnetic field is such a magnetic field by which the relationship between the magnetization directions of the pinned layer and the free layer in each TMR effect element 33 is kept constant.

Next, the pair of probes 91a are electrically contacted to the signal electrodes 35 of the TMR effect element to be evaluated in the row bar 90, and a bias voltage of, for example, 50 to 300 mV, preferably 150 to 200 mV, is applied to the TMR effect element through the bias and constant current power supply 91b for 5µ sec in this condition (step $S_S2$). Here, the duration of application of the bias voltage may be longer than 5 µsec, for example, on the order of 200 µsec.

Next, the output voltage from the TMR effect element is measured using the voltage measurement circuit 91c, the output voltage value is input to the computer 91g and the electric popping output voltage $\Delta V_P$ generated in the output voltage of the TMR effect element is measured (step $S_S3$).

Next, the application of the saturation direct magnetic field to the row bar 90 is stopped (step $S_S4$). A magnetic field equivalent to the signal field is then applied to the row bar 90 (step $S_S5$).

Next, using the bias and constant current power supply 91b, a predetermined sense current is applied to the TMR effect element (step $S_S6$). Next, the output voltage from the TMR effect element is measured using the voltage measurement circuit 91c and the element output voltage $\Delta V_S$ is loaded into the computer 91g (step $S_S7$).

Next, the application of the magnetic field equivalent to the signal field to the row bar 90 is stopped (step $S_S8$).

The ratio between the electric popping output voltage $\Delta V_P$ and the element output voltage $\Delta V_S$ is calculated and it is judged whether the calculation result $\Delta V_P/\Delta V_S$ is greater than 0 and smaller than 0.2 or not (step $S_S9$).

When $\Delta V_P/\Delta V_S$ is greater than 0 and smaller than 0.2, the TMR effect element has low resistance and is judged as a non-defective product with the electric popping output voltage restricted (step $S_S10$), and when $\Delta V_P/\Delta V_S$ is not in that range, the TMR effect element is judged as a defective product (step $S_S11$). Next, similar judgments are performed on the other TMR effect elements of the row bar 90 one by one.

Figure 17:
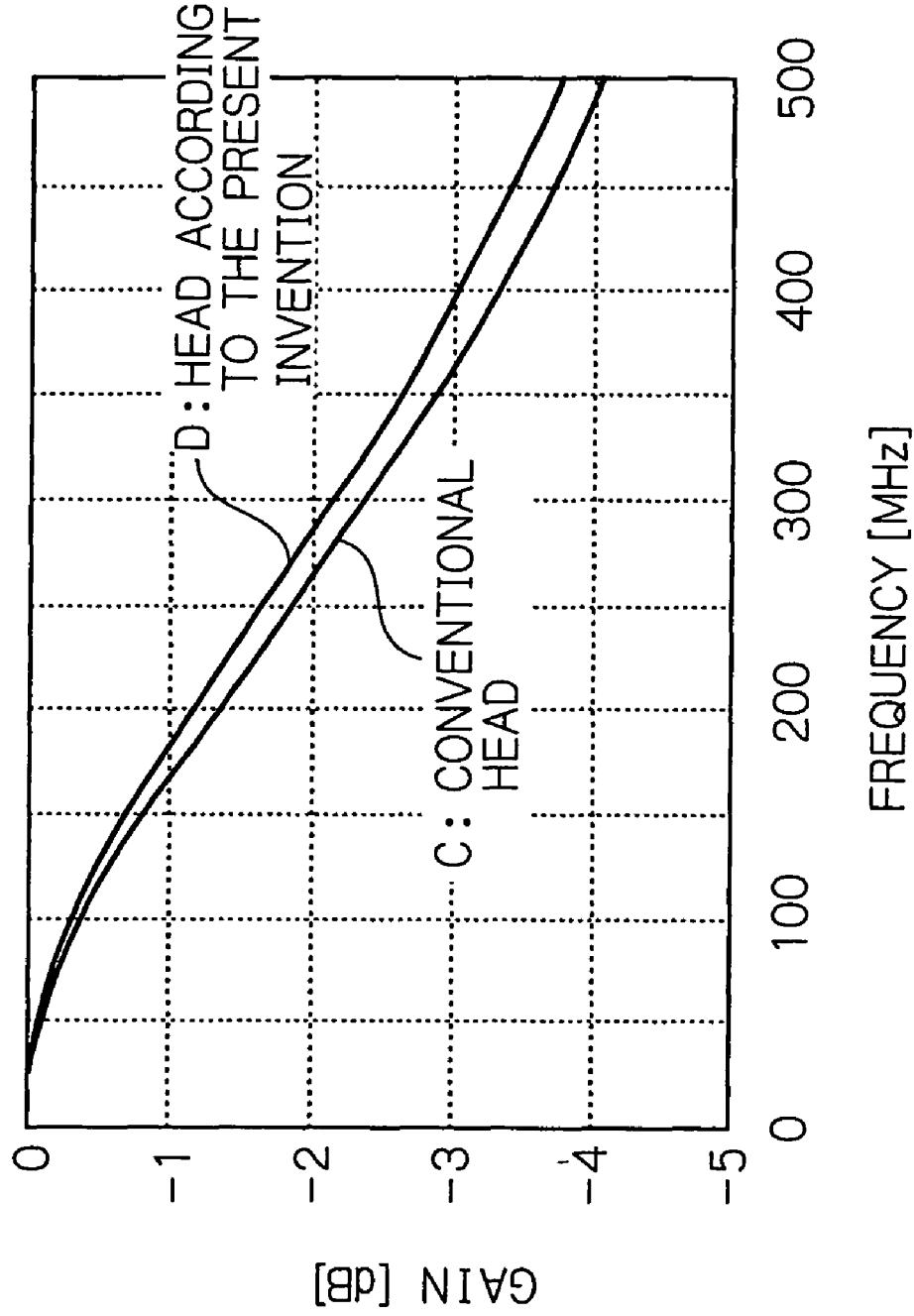
FIG. 17 shows a characteristic graph illustrating the result of a simulation of the frequency characteristic of read output gain of a thin-film magnetic head according to the present invention.

FIG. 17 shows a characteristic graph illustrating the result of a simulation of the frequency characteristic of read output gain of a thin-film magnetic head according to the present invention. In the same figure, a characteristic C is a characteristic of a thin-film magnetic head having a conventional tunnel insulating layer. Here, suppose the resistance of the tunnel insulating layer is 400 ohm and the parasitic capacitance is 1.5 pF. Furthermore, a characteristic D is a characteristic of a thin-film magnetic head having a low-resistance tunnel barrier layer according to the present invention. Here, suppose the resistance of the low-resistance tunnel barrier layer corresponds to resistance 400 ohm of the tunnel barrier in parallel to resistance 1500 ohm of electric conduction of electric charge sites. Here, the combined resistance value of both resistances is 316 ohm. Therefore, the thin-film magnetic head of the present invention corresponding to the characteristic D has a reduced element resistance compared to the conventional thin-film magnetic head corresponding to the characteristic C. The parasitic capacitance is likewise assumed to be 1.5 pF. Furthermore, suppose the impedance and the connection length of the wiring connection part of both heads are 76 ohm and 35 mm respectively, and the input impedance and the parasitic capacitance of the preamplifier of both heads are 7 ohm and 5 pF respectively.

According to the same figure, the thin-film magnetic head D according to the present invention has a gain exceeding that of the conventional head C in the entire frequency range in the figure except the extremely low-frequency area. That is, it is understandable that the thin-film magnetic head according to the present invention has an improved high frequency characteristic with the use of an appropriate low-resistance TMR effect element.

Further, many widely different alternations and modifications of the present invention may be constructed without departing from the spirit and scope of the present invention. Accordingly, the present invention is limited only as defined in the following claims and equivalents thereto.

The invention claimed is:

1. A tunnel magnetoresistive effect element comprising:
a tunnel barrier layer formed primarily of a metal oxide; and
two ferromagnetic layers stacked so as to sandwich said tunnel barrier layer,
said tunnel barrier layer including many electric charge sites which cause electric popping noise, the electric popping noise being separated and distinguished, by setting said tunnel magnetoresistive effect element to be magnetically saturated, from a popping noise caused by a magnetization state of the element,
electric popping output voltage, which is a maximum absolute voltage of peaks and valleys of said electric popping noise, being provided when a bias voltage is applied for a predetermined measuring time in a direction perpendicular to a surface of said tunnel barrier layer with said tunnel magnetoresistive effect element magnetically saturated, and
a density of said electric charge sites in said tunnel barrier layer being controlled by limiting said electric popping output voltage so that $\Delta V_p$ satisfies a relationship of:

$$0 < \Delta V_p / \Delta V_s < 0.2,$$

where $\Delta V_p$ is a value of said electric popping output voltage and $\Delta V_s$ is a value of element output voltage, the element output voltage being defined as a difference between maximum and minimum values of resistance during reading of said tunnel magnetoresistive effect element.

2. The tunnel magnetoresistive effect element as claimed in claim 1, wherein said tunnel barrier layer is formed primarily of a compound of metal or alloy made of one, two or more elements of Al, Ti, Mg, Hf, Zr, Si, Ta, Mo and W with oxygen, or of a compound of alloy with oxygen obtained by adding one, two or more elements of Fe, Ni, Cr, Mn, Co, Rh, Pd, Cd, Ir, Zn,
Ba, Ca, Li, Na, K and P, having a lower oxidation free energy than said metal or alloy, to said metal or alloy.

3. The tunnel magnetoresistive effect element as claimed in claim 1, wherein said tunnel barrier layer is formed by oxidizing a metal layer in an atmosphere including one, two or more of oxygen molecules, oxygen atoms, oxygen ions, ozone and dinitrogen oxide.

4. The tunnel magnetoresistive effect element as claimed in claim 3, wherein said metal layer is formed primarily of a metal or alloy made of one, two or more elements of Al, Ti, Mg, Hf, Zr, Si, Ta, Mo and W, or of an alloy obtained by adding one, two or more elements of Fe, Ni, Cr, Mn, Co, Rh, Pd, Cd, Ir, Zn, Ba, Ca, Li, Na, K and P, having a lower oxidation free energy than said metal or alloy, to said metal or alloy.

5. A thin-film magnetic head comprising:
at least one tunnel magnetoresistive effect element as data reading means comprising:
a tunnel barrier layer formed primarily of a metal oxide; and two ferromagnetic layers stacked so as to sandwich said tunnel barrier layer, said tunnel barrier layer including many electric charge sites which cause electric popping noise, the electric popping noise being separated and distinguished, by setting said tunnel magnetoresistive effect element to be magnetically saturated, from a popping noise caused by a magnetization state of the element, electric popping output voltage, which is a maximum absolute voltage of peaks and valleys of said electric popping noise, being provided when a bias voltage is applied for a predetermined measuring time in a direction perpendicular to a surface of said tunnel barrier layer with said tunnel magnetoresistive effect element magnetically saturated, and a density of said electric charge sites in said tunnel barrier layer being controlled by limiting said electric popping output voltage so that $\Delta V_p$ satisfies a relationship of:

$$0 < \Delta V_p / \Delta V_s < 0.2,$$

where $\Delta V_p$ is a value of said electric popping output voltage and $\Delta V_s$ is a value of element output voltage, the element output voltage being defined as a difference between maximum and minimum values of resistance during reading of said tunnel magnetoresistive effect element; and at least one inductive write head element as data writing means.

6. A head gimbal assembly comprising:
a thin-film magnetic head comprising:
at least one tunnel magnetoresistive effect element as data reading means comprising:
a tunnel barrier layer formed primarily of a metal oxide; and
two ferromagnetic layers stacked so as to sandwich said tunnel barrier layer,
said tunnel barrier layer including many electric charge sites which cause electric popping noise, the electric popping noise being separated and distinguished, by setting said tunnel magnetoresistive effect element to be magnetically saturated, from a popping noise caused by a magnetization state of the element,
electric popping output voltage, which is a maximum absolute voltage of peaks and valleys of said electric popping noise, being provided when a bias voltage is applied for a predetermined measuring time in a direction perpendicular to a surface of said tunnel barrier layer with said tunnel magnetoresistive effect element magnetically saturated, and
a density of said electric charge sites in said tunnel barrier layer being controlled by limiting said electric popping output voltage so that $\Delta V_p$ satisfies a relationship of:

$$0 < \Delta V_p / \Delta_s < 0.2,$$

where $\Delta V_p$ is a value of said electric popping output voltage and $\Delta V_s$ is a value of element output voltage, the element output voltage being defined as a difference between maximum and minimum values of resistance during reading of said tunnel magnetoresistive effect element; and at least one inductive write head element as data writing means;

trace conductors for supplying currents to said at least one tunnel magnetoresistive effect element and said at least one inductive write head element; and a support mechanism which supports said thin-film magnetic head.

7. A magnetic disk drive apparatus comprising:
at least one head gimbal assembly comprising:
a thin-film magnetic head comprising:
at least one tunnel magnetoresistive effect element as data reading means comprising:
a tunnel barrier layer formed primarily of a metal oxide; and
two ferromagnetic layers stacked so as to sandwich said tunnel barrier layer,
said tunnel barrier layer including many electric charge sites which cause electric popping noise, the electric popping noise being separated and distinguished, by setting said tunnel magnetoresistive effect element to be magnetically saturated, from a popping noise caused by a magnetization state of the element,
electric popping output voltage, which is a maximum absolute voltage of peaks and valleys of said electric popping noise, being provided when a bias voltage is applied for a predetermined measuring time in a direction perpendicular to a surface of said tunnel barrier layer with said tunnel magnetoresistive effect element magnetically saturated, and
a density of said electric charge sites in said tunnel barrier layer being controlled by limiting said electric popping output voltage so that $\Delta V_p$ satisfies a relationship of:

$$0 < \Delta V_p / \Delta V_s < 0.2,$$

where $\Delta V_p$ is a value of said electric popping output voltage and $\Delta V_s$ is a value of element output voltage, the element output voltage being defined as a difference between maximum and minimum values of resistance during reading of said tunnel magnetoresistive effect element; and at least one inductive write head element as data writing means;

trace conductors for supplying currents to said at least one tunnel magnetoresistive effect element and said at least one inductive write head element; and a support mechanism which supports said thin-film magnetic head;

at least one magnetic disk; and a recording/reproducing circuit for controlling reading and writing operations by said at least one tunnel magnetoresistive effect element and said at least one inductive write head element.

* * * * *